United States Patent
Nishimura

(10) Patent No.: US 12,204,126 B2
(45) Date of Patent: Jan. 21, 2025

(54) OPTICAL FILM AND ELECTROLUMINESCENCE DISPLAY DEVICE

(71) Applicant: FUJIFILM Corporation, Tokyo (JP)

(72) Inventor: Naoya Nishimura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 63 days.

(21) Appl. No.: 18/354,234

(22) Filed: Jul. 18, 2023

(65) Prior Publication Data
US 2023/0358935 A1 Nov. 9, 2023

Related U.S. Application Data

(63) Continuation of application No. PCT/JP2022/001950, filed on Jan. 20, 2022.

(30) Foreign Application Priority Data

Jan. 21, 2021 (JP) ................. 2021-008018

(51) Int. Cl.
| | |
|---|---|
| G02B 5/30 | (2006.01) |
| C09K 19/52 | (2006.01) |
| G02B 1/10 | (2015.01) |
| G02F 1/00 | (2006.01) |

(52) U.S. Cl.
CPC ............ G02B 5/3016 (2013.01); C09K 19/52 (2013.01); G02B 1/10 (2013.01); G02F 1/0063 (2013.01); *C09K 2019/525* (2013.01)

(58) Field of Classification Search
CPC . G02B 5/3016; C09K 19/52; C09K 2019/525
USPC ..................... 349/96–98, 117–121
See application file for complete search history.

(56) References Cited

U.S. PATENT DOCUMENTS

2023/0074182 A1\* 3/2023 Haag ..................... H10K 50/86
2023/0205011 A1  6/2023 Muto

FOREIGN PATENT DOCUMENTS

| JP | 2015-102811 A | 6/2015 |
|---|---|---|
| JP | 2018-106114 A | 7/2018 |
| WO | 2019/235355 A1 | 12/2019 |

OTHER PUBLICATIONS

Fangwang Gou et al., Angular Color Shift of Micro-LED Displays, Optics Express, Jun. 10, 2019, A746-A757, vol. 27, No. 12, FI, USA.
International Search Report issued in PCT/JP2022/001950 on Apr. 5, 2022.
Written Opinion issued in PCT/JP2022/001950 on Apr. 5, 2022.
International Preliminary Report on Patentability completed by WIPO on Jul. 20, 2023 in connection with International Patent Application No. PCT/JP2022/001950.
Fangwang Gou et al., Angular Color Shift of Micro-LED Displays, Optics Express, Jun. 10, 2019, A746-A747, vol. 27, No. 12, FI, USA.

\* cited by examiner

*Primary Examiner* — Charles S Chang
(74) *Attorney, Agent, or Firm* — Edwards Neils LLC; Jean C. Edwards, Esq.

(57) ABSTRACT

Provided is an optical film and an electroluminescence display device that suppress a decrease in transmittance of a front surface and suppress a change in tint in an oblique direction with respect to the front surface, in a case of being used in a micro LED. The optical film includes a light absorption anisotropic layer containing a dichroic coloring agent compound, in which the light absorption anisotropic layer has an absorption axis in a normal direction of the film and has an alignment degree of 0.7 or greater at 530 nm, and in a case where transmittances at 460 nm, 530 nm, and 630 nm in a direction of 45° with respect to the normal direction of the film are respectively defined as Tb, Tg, and Tr, relationships of Expressions $0.1 \leq Tb/Tr \leq 0.5$ (1) and $0.2 \leq Tg/Tr \leq 0.6$ (2) are satisfied.

20 Claims, No Drawings

OPTICAL FILM AND ELECTROLUMINESCENCE DISPLAY DEVICE

CROSS-REFERENCE TO RELATED APPLICATIONS

This application is a Continuation of PCT International Application No. PCT/JP2022/001950 filed on Jan. 20, 2022, which was published under PCT Article 21(2) in Japanese, and which claims priority under 35 U.S.C. § 119 (a) to Japanese Patent Application No. 2021-008018 filed on Jan. 21, 2021. The above applications are hereby expressly incorporated by reference, in their entirety, into the present application.

BACKGROUND OF THE INVENTION

1. Field of the Invention

The present invention relates to an optical film and an electroluminescence display device.

2. Description of the Related Art

An LED display formed of a light emitting diode (LED), which is a self-light emitting element, has been developed.

In particular, a micro LED display, on which a chip-like micro LED is mounted, has been developed and attracting attention in recent years as a display device that can easily achieve both high definition and an increase size.

In the micro LED, InGaN/GaN is typically used in a G light emitting element and a B light emitting element, and GaInP/AlGaInP is typically used in an R light emitting element, and in a case where a tint in a front direction is adjusted to be neutral, a tint in an oblique direction is shifted due to a difference in refractive index thereof, a phenomenon in which the brightness derived from green (G) and blue (B) increases occurs (Optics Express 27 (12) A746 to A757).

SUMMARY OF THE INVENTION

The present inventors have examined placement of a layer having absorbers of G and B on a surface of a micro LED in order to neutralize the tint in an oblique direction, and clarified that the tint in the oblique direction can be neutralized, but the transmittance of a front surface is greatly decreased.

Therefore, an object of the present invention is to provide an optical film and an electroluminescence display device that are capable of suppressing a decrease in transmittance of a front surface and suppressing a change in tint in an oblique direction with respect to the front surface, in a case of being used in a micro LED.

As a result of intensive examination conducted by the present inventors in order to achieve the above-described object, it was found that in an optical film including a light absorption anisotropic layer containing a dichroic coloring agent compound, the light absorption anisotropic layer has an absorption axis in a normal direction of the film and has an alignment degree of 0.7 or greater at 530 nm, and in a case where a transmittance at a specific wavelength in a direction of 45° with respect to the normal direction of the film satisfies a specific relationship, a decrease in transmittance of a front surface is suppressed, and a change in tint in an oblique direction with respect to the front surface can be suppressed in a case where the optical film is used in a micro LED.

That is, the present inventors found that the above-described object can be achieved by employing the following configurations.

[1] An optical film comprising: a light absorption anisotropic layer containing a dichroic coloring agent compound, in which the light absorption anisotropic layer has an absorption axis in a normal direction of the film and has an alignment degree of 0.7 or greater at 530 nm, and in a case where transmittances at 460 nm, 530 nm, and 630 nm in a direction of 45° with respect to the normal direction of the film are respectively defined as Tb, Tg, and Tr, relationships of Expressions (1) and (2) are satisfied.

$$0.1 \leq Tb/Tr \leq 0.5 \quad (1)$$

$$0.2 \leq Tg/Tr \leq 0.6 \quad (2)$$

[2] The optical film according to [1], in which the light absorption anisotropic layer contains two or more kinds of the dichroic coloring agent compounds.

[3] The optical film according to [1] or [2], in which the light absorption anisotropic layer contains a dichroic coloring agent compound having an absorption peak at 430 nm or greater and less than 500 nm and a dichroic coloring agent compound having an absorption peak at 500 nm or greater and 560 nm or less.

[4] The optical film according to any one of [1] to [3], in which the transmittance at 530 nm in the normal direction of the film is 50% or greater.

[5] The optical film according to any one of [1] to [4], in which the transmittance at 530 nm in the normal direction of the film is 70% or greater.

[6] The optical film according to any one of [1] to [5], in which the transmittance at 630 nm in the normal direction of the film is 75% or greater.

[7] An electroluminescence display device, in which the optical film according to any one of [1] to [6] is laminated on an electroluminescence substrate including light emitting elements of multiple colors by electroluminescence.

[8] The electroluminescence display device according to [7], in which the light emitting elements are light emitting diodes.

[9] The electroluminescence display device according to [8], in which the light emitting diodes have three colors of red, green, and blue, and in a case where brightnesses of the colors at 460 nm, 530 nm, and 630 nm in a normal direction of the electroluminescence display device are respectively defined as Lb, Lg, and Lr, both relationships of Expressions (3) and (4) are satisfied.

$$3 \leq Lg/Lb \leq 8 \quad (3)$$

$$0.5 \leq Lr/Lb \leq 2.5 \quad (4)$$

According to the present invention, it is possible to provide an optical film and an electroluminescence display device that are capable of suppressing a decrease in transmittance of a front surface and suppressing a change in tint in an oblique direction with respect to the front surface, in a case of being used in a micro LED.

DESCRIPTION OF THE PREFERRED EMBODIMENTS

Hereinafter, the present invention will be described in detail.

The description of configuration requirements described below may be made based on typical embodiments of the present invention, but the present invention is not limited to such embodiments.

Further, in the present specification, the numerical ranges shown using "to" indicate ranges including the numerical values described before and after "to" as the lower limits and the upper limits.

Further, in the present specification, the terms parallel, orthogonal, and normal do not indicate parallel, orthogonal, and normal in a strict sense, but respectively indicate ranges of ±5° from parallel, orthogonal, and normal.

Further, in the present specification, the concepts of the liquid crystal composition and the liquid crystal compound also include those that no longer exhibit liquid crystallinity due to curing or the like.

Further, in the present specification, materials corresponding to respective components may be used alone or in combination of two or more kinds thereof. Here, in a case where two or more kinds of materials corresponding to respective components are used in combination, the content of the components indicates the total content of the materials used in combination unless otherwise specified.

Further, in the present specification, "(meth)acrylate" denotes "acrylate" or "methacrylate", "(meth)acryl" denotes "acryl" or "methacryl", and "(meth)acryloyl" denotes "acryloyl" or "methacryloyl".

In the present invention, visible light is light having a wavelength that can be seen by human eyes among electromagnetic waves and indicates light in a wavelength range of 380 to 780 nm. Invisible light is light in a wavelength range of less than 380 nm and in a wavelength range of greater than 780 nm.

[Optical Film]

The optical film according to the embodiment of the present invention is an optical film including a light absorption anisotropic layer containing a dichroic coloring agent compound.

Further, the light absorption anisotropic layer of the optical film according to the embodiment of the present invention has an absorption axis in a normal direction of the film and has an alignment degree of 0.7 or greater at 530 nm.

Further, the optical film according to the embodiment of the present invention is an optical film in which in a case where transmittances at 460 nm, 530 nm, and 630 nm in a direction of 45° with respect to a normal direction of the film are respectively defined as Tb, Tg, and Tr, relationships of Expressions (1) and (2) are satisfied.

$$0.1 \leq Tb/Tr \leq 0.5 \quad (1)$$

$$0.2 \leq Tg/Tr \leq 0.6 \quad (2)$$

Here, the expression "has an absorption axis in the normal direction of the film" in regard to the light absorption anisotropic layer denotes that the light absorption anisotropic layer has an absorption axis in a range of ±5° in the normal direction of the surface of the light absorption anisotropic layer, that is, in the normal direction (90°) in a strict sense.

Further, the absorption axis denotes the direction of the absorption axis (the major axis direction of a molecule) of the dichroic coloring agent compound contained in the light absorption anisotropic layer, and in the present invention, the absorption axis can be confirmed as the direction in which the transmittance is the highest in a case where the transmittance is measured by changing the inclination angle (polar angle) and the inclination direction (azimuthal angle) with respect to the normal direction of the surface of the light absorption anisotropic layer.

Specifically, the Mueller matrix at a wavelength of 550 nm is measured using AxoScan OPMF-1 (manufactured by Opto Science, Inc.). More specifically, in the measurement, the azimuthal angle at which the absorption axis is inclined is first searched for, the Mueller matrix at a wavelength of 550 nm is measured while the polar angle which is the angle with respect to the normal direction of the surface of the light absorption anisotropic layer is changed from −70° to 70° at intervals of 1° in the surface (the plane that has the absorption axis and is orthogonal to the layer surface) having the normal direction of the light absorption anisotropic layer along the azimuthal angle thereof, and the transmittance of the light absorption anisotropic layer is derived. As a result, the direction at which the highest transmittance is exhibited is defined as the absorption axis.

Further, "transmissions at 460 nm, 530 nm, and 630 nm in a direction of 45° with respect to the normal direction of the film" in regard to the optical film denote values measured in the following manner and derived.

First, the Mueller matrix of the optical film at each measurement wavelength is measured using AxoScan OPMF-1 (manufactured by Opto Science, Inc.). Specifically, the Mueller matrix of the optical film at each measurement wavelength is measured by setting the polar angle, which is an angle with respect to the normal direction of the optical film, to 45°, and the transmittance of the optical film is derived.

In the measurement of the transmittance, the normal direction as a reference of the polar angle denotes the normal direction (90°) in a strict sense.

In the present invention, as described above, in a case where the light absorption anisotropic layer has an absorption axis in the normal direction of the film and has an alignment degree of 0.7 or greater at 530 nm and the transmittances at specific wavelengths in a direction of 45° with respect to the normal direction of the optical film satisfy the relationships of Expressions (1) and (2), a decrease in transmittance of a front surface can be suppressed and a change in tint in an oblique direction with respect to the front surface can be suppressed in a case where the film is used in a micro LED.

The reason for this is not clear, but the present inventors presume as follows.

That is, since the light absorption anisotropic layer has an absorption axis in the normal direction of the film and has an alignment degree of 0.7 or greater at 530 nm, a decrease in transmittance of the front surface can be suppressed. The reason for this is considered to be that the transmittance of the light absorption anisotropic layer in the direction along the absorption axis is increased because the dichroic coloring agent compound contained in the light absorption anisotropic layer is aligned vertically to the surface of the light absorption anisotropic layer.

Further, the transmittances at specific wavelengths in a direction of 45° with respect to the normal direction of the optical film satisfy the relationships of Expressions (1) and (2), and thus a change in tint in an oblique direction with respect to the front surface can be suppressed. The reason for this is considered to be that the relationships of Expressions (1) and (2) are satisfied, and thus the brightness ratio between red, green, and blue, which affect the change in tint in an oblique direction, reaches a value approximated to the brightness ratio between red, green, and blue in a case where the tint in the front direction is adjusted to be neutral.

In the optical film according to the embodiment of the present invention, in a case where transmittances at 460 nm, 530 nm, and 630 nm in a direction of 45° with respect to the normal direction of the optical film are respectively defined as Tb (45), Tg (45), and Tr (45), both relationships of Expressions (1) and (2) are satisfied as described above, and from the viewpoint of further suppressing a change in tint in an oblique direction, it is preferable that both the relationships of Expressions (1-2) and (2-2) are satisfied.

$$0.1 \leq Tb(45)/Tr(45) \leq 0.5 \tag{1}$$

$$0.2 \leq Tg(45)/Tr(45) \leq 0.6 \tag{2}$$

$$0.2 \leq Tb(45)/Tr(45) \leq 0.4 \tag{1-2}$$

$$0.3 \leq Tg(45)/Tr(45) \leq 0.5 \tag{2-2}$$

Further, in the optical film according to the embodiment of the present invention, in a case where the transmittances at 450 nm, 530 nm, and 630 nm in the normal direction of the film are respectively defined as Tb (0), Tg (0), and Tr (0), Tb (0) is preferably 50% or greater and more preferably 70% or greater. Further, Tg (0) is preferably 50% or greater and more preferably 70% or greater. Further, Tr (0) is preferably 75% or greater and more preferably 80% or greater. In this manner, a decrease in the transmittance of the front surface can be further suppressed.

Here, the transmittance at each wavelength in the normal direction of the film denotes a value measured in the following manner and calculated.

First, the Mueller matrix of the optical film at each measurement wavelength is measured using AxoScan OPMF-1 (manufactured by Opto Science, Inc.). Specifically, the polar angle, which is an angle with respect to the normal direction of the optical film, is measured from −70° to 70° at intervals of 5°. The transmittance (front transmittance) at each wavelength is calculated from the average value of Tmax and Tmin of this measurement result.

[Light Absorption Anisotropic Layer]

As described above, the light absorption anisotropic layer of the optical film according to the embodiment of the present invention has absorption in the normal direction of the film.

Here, in order to control the absorption axis of the light absorption anisotropic layer, an aspect in which a dichroic coloring agent compound (for example, an organic dichroic coloring agent) described below is aligned is preferable, and an aspect in which a dichroic coloring agent compound is aligned by using the alignment of the liquid crystal compound is more preferable. As an example of such a preferred embodiment, a light absorption anisotropic layer in which at least one kind of dichroic coloring agent compound is aligned vertically to the in-plane is exemplified.

As the technique of desirably aligning the dichroic coloring agent compound, a technique of preparing a polarizer formed of a dichroic coloring agent compound or a technique of preparing a guest-host liquid crystal cell can be referred to. For example, techniques used in the method of preparing a dichroic polarizer described in JP1999-305036A (JP-H11-305036A) or JP2002-90526A and the method of preparing a guest-host type liquid crystal display device described in JP2002-99388A or JP2016-27387A can be used for preparation of the light absorption anisotropic layer used in the present invention.

For example, molecules of the dichroic coloring agent compound can be desirably aligned as described above in association with the alignment of host liquid crystals using the technique of the guest-host type liquid crystal cell. Specifically, the light absorption anisotropic layer used in the present invention can be prepared by mixing a dichroic coloring agent compound serving as a guest and a rod-like liquid crystal compound serving as a host liquid crystal, aligning the host liquid crystal, aligning molecules of the dichroic coloring agent compound along the alignment of the liquid crystal molecules, and fixing the alignment state.

It is preferable that the alignment of the dichroic coloring agent compound is fixed by forming a chemical bond in order to prevent fluctuation of the light absorption characteristics of the light absorption anisotropic layer used in the present invention depending on the use environment. For example, the alignment can be fixed by promoting the polymerization of the host liquid crystal, the dichroic coloring agent compound, and the polymerizable component to be added as desired.

Further, a polymer film that satisfies the light absorption characteristics required for the light absorption anisotropic layer used in the present invention can be prepared by allowing the dichroic coloring agent compound to permeate into the polymer film and aligning the dichroic coloring agent compound along the alignment of the polymer molecules in the polymer film. Specifically, the polymer film can be prepared by coating a surface of the polymer film with a solution of the dichroic coloring agent compound and allowing the solution to permeate into the film. The alignment of the dichroic coloring agent compound can be adjusted by the alignment of a polymer chain in the polymer film, the properties thereof (chemical and physical properties of the polymer chain, a functional group of the polymer chain, and the like), the coating method, and the like. The details of this method are described in JP2002-90526A.

Further, as described above, the light absorption anisotropic layer of the optical film according to the embodiment of the present invention has an alignment degree S of 0.7 or greater at 530 nm, but is preferably 0.9 or greater from the viewpoint of further suppressing a decrease in transmittance of the front surface.

Here, the alignment degree measured at a wavelength of λ nm is defined as follows in the present specification.

In the measurement, the Mueller matrix at a wavelength of 530 nm at each polar angle is measured while the polar angle which is the angle with respect to the normal direction of the light absorption anisotropic layer is changed from 0° to 90° at intervals of 5° using AxoScan OPMF-1 (manufactured by Opto Science, Inc.), and the minimum transmittance (Tmin) is derived. Next, after removal of the influence of surface reflection, Tmin at a polar angle at which Tmin is highest is defined as Tm (0), and Tmin in a direction in which the polar angle is further increased by 40° from the polar angle at which Tmin is highest is defined as Tm (40). The absorbance is calculated by the following equation based on the obtained Tm (0) and Tm (40), and A (0) and A (40) are calculated.

$$A = -\log(Tm)$$

Here, Tm represents a transmittance and A represents an absorbance.

An alignment degree S at a wavelength of 530 nm defined by the following equation is calculated based on the calculated A (0) and A (40).

$$S = (4.6 \times A(40) - A(0))/(4.6 \times A(40) + 2 \times A(0))$$

<Dichroic Coloring Agent Compound>

The dichroic coloring agent compound contained in the light absorption anisotropic layer is not particularly limited, and a known dichroic coloring agent compound of the related art can be used, and it is particularly preferable to use a dichroic azo coloring agent compound.

The dichroic azo coloring agent compound is not particularly limited, and known dichroic azo coloring agents of the related art can be used, but the compounds described below are preferably used.

In the present invention, the dichroic azo coloring agent compound denotes a coloring agent having different absorbances depending on the direction.

The dichroic azo coloring agent compound may or may not exhibit liquid crystallinity.

In a case where the dichroic azo coloring agent compound exhibits liquid crystallinity, the dichroic azo coloring agent compound may exhibit any of nematic liquid crystallinity or smectic liquid crystallinity. The temperature range in which the liquid crystal phase is exhibited is preferably room temperature (approximately 20° C. to 28° C.) to 300° C. and from the viewpoints of handleability and manufacturing suitability, more preferably 50° C. to 200° C.

In the present invention, from the viewpoint of adjusting the tint, it is preferable that the light absorption anisotropic layer contains two or more kinds of dichroic coloring agent compounds (particularly, dichroic azo coloring agent compounds).

In the present invention, from the viewpoint of adjusting the tint, the light absorption anisotropic layer contains preferably a dichroic coloring agent compound having an absorption peak at a wavelength of 430 nm or greater and 560 nm or less and more preferably at least one dichroic coloring agent compound having an absorption peak at a wavelength of 430 nm or greater and less than 500 nm (for example, a second dichroic azo coloring agent compound described below) and at least one dichroic coloring agent compound having an absorption peak at a wavelength of 500 nm or greater and 560 nm or less (for example, a first dichroic azo coloring agent compound described below). Specifically, it is particularly preferable that the light absorption anisotropic layer contains at least a dichroic azo coloring agent compound represented by Formula (5) and a dichroic azo coloring agent compound represented by Formula (6).

Further, in the present invention, from the viewpoint of adjusting the tint, the light absorption anisotropic layer has preferably no dichroic coloring agent compound having an absorption peak at a wavelength of 600 nm or greater and 700 nm or less and more preferably no dichroic coloring agent compound having absorption at a wavelength of 600 nm or greater and 700 nm or less.

In the present invention, from the viewpoint of further enhancing pressing resistance, it is preferable that the dichroic azo coloring agent compound contains a crosslinkable group.

Specific examples of the crosslinkable group include a (meth)acryloyl group, an epoxy group, an oxetanyl group, and a styryl group. Among these, a (meth)acryloyl group is preferable.

(First Dichroic Azo Coloring Agent Compound)

It is preferable that the first dichroic azo coloring agent compound is a compound having a chromophore which is a nucleus of a dichroic azo coloring agent compound and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic hydrocarbon group and an azo group is preferable, and a bisazo or trisazo structure containing an aromatic hydrocarbon group and two or three azo groups is more preferable.

The side chain is not particularly limited, and examples thereof include a group represented by R4, R5, or R6 in Formula (5).

The first dichroic azo coloring agent compound is a dichroic azo coloring agent compound having a maximum absorption wavelength in a wavelength range of 500 nm or greater and 560 nm or less, from the viewpoint of adjusting the tint, preferably a dichroic azo coloring agent compound having a maximum absorption wavelength in a wavelength range of 510 to 550 nm and more preferably a dichroic azo coloring agent compound having a maximum absorption wavelength in a wavelength range of 520 to 540 nm.

From the viewpoint of further improving the alignment degree of the polarizer, it is preferable that the first dichroic azo coloring agent compound is a compound represented by Formula (5).

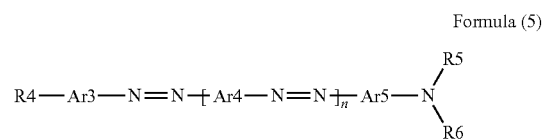

Formula (5)

In Formula (5), n represents 1 or 2.

In Formula (5), Ar3, Ar4, and Ar5 each independently represent a phenylene group which may have a substituent, a naphthylene group which may have a substituent, or a heterocyclic group which may have a substituent.

The heterocyclic group may be aromatic or non-aromatic.

The atoms other than carbon constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

In Formula (5), R4 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group.

Further, —CH$_2$— constituting the alkyl group may be substituted with —O—, —CO—, —C(O)—O—, —O—C(O)—, —Si(CH$_3$)$_2$—O—Si(CH$_3$)$_2$—, —N(R1')—, —N(R1')-CO—, —CO—N(R1')—, —N(R1')-C(O)—O—, —O—C(O)—N(R1')—, —N(R1')-C(O)—N(R1')—, —CH=CH—, —C≡C—, —N=N—, —C(R1')=CH—C(O)—, or —O—C(O)—O—.

In a case where R4 represents a group other than a hydrogen atom, the hydrogen atom in each group may be substituted with a halogen atom, a nitro group, a cyano group, —N(R1')$_2$, an amino group, —C(R1')=C(R1')-NO$_2$, —C(R1')=C(R1')-CN, or —C(R1')=C(CN)$_2$.

R1' represents a hydrogen atom or a linear or branched alkyl group having 1 to 6 carbon atoms. In a case where a plurality of (R1')'s are present in each group, these may be the same as or different from one another.

In Formula (5), R5 and R6 each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

Further, —CH$_2$— constituting the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—, —NR2'—CO—, —CO—NR2'-NR2'-C(O)—O—, —O—C(O)—NR2'-, —NR2'-C(O)—NR2'-, —CH=CH—, —C≡C—, —N=N—, —C(R2')=CH—C(O)—, or —O—C(O)—O—.

In a case where R2 and R3 represent a group other than a hydrogen atom, the hydrogen atom of each group may be substituted with a halogen atom, a nitro group, a cyano group, a —OH group, —N(R2')$_2$, an amino group, —C(R2')=C(R2')-NO$_2$, —C(R2')=C(R2')-CN, or —C(R2')=C(CN)$_2$.

R2' represents a hydrogen atom or a linear or branched alkyl group having 1 to 6 carbon atoms. In a case where a plurality of (R2')'s are present in each group, these may be the same as or different from one another.

R5 and R6 may be bonded to each other to form a ring, or R5 or R6 may be bonded to Ar2 to form a ring.

From the viewpoint of the light resistance, it is preferable that R4 represents an electron-withdrawing group and R5 and R6 represent a group having a low electron-donating property.

Among such groups, specific examples of a case where R4 represents an electron-withdrawing group are the same as the specific examples of a case where R1 represents an electron-withdrawing group, and specific examples of a case where R5 and R6 represent a group having a low electron-donating property are the same as the specific examples of a case where R2 and R3 represent a group having a low electron-donating property.

Specific examples of the first dichroic azo coloring agent compound are shown below, but the present invention is not limited thereto.

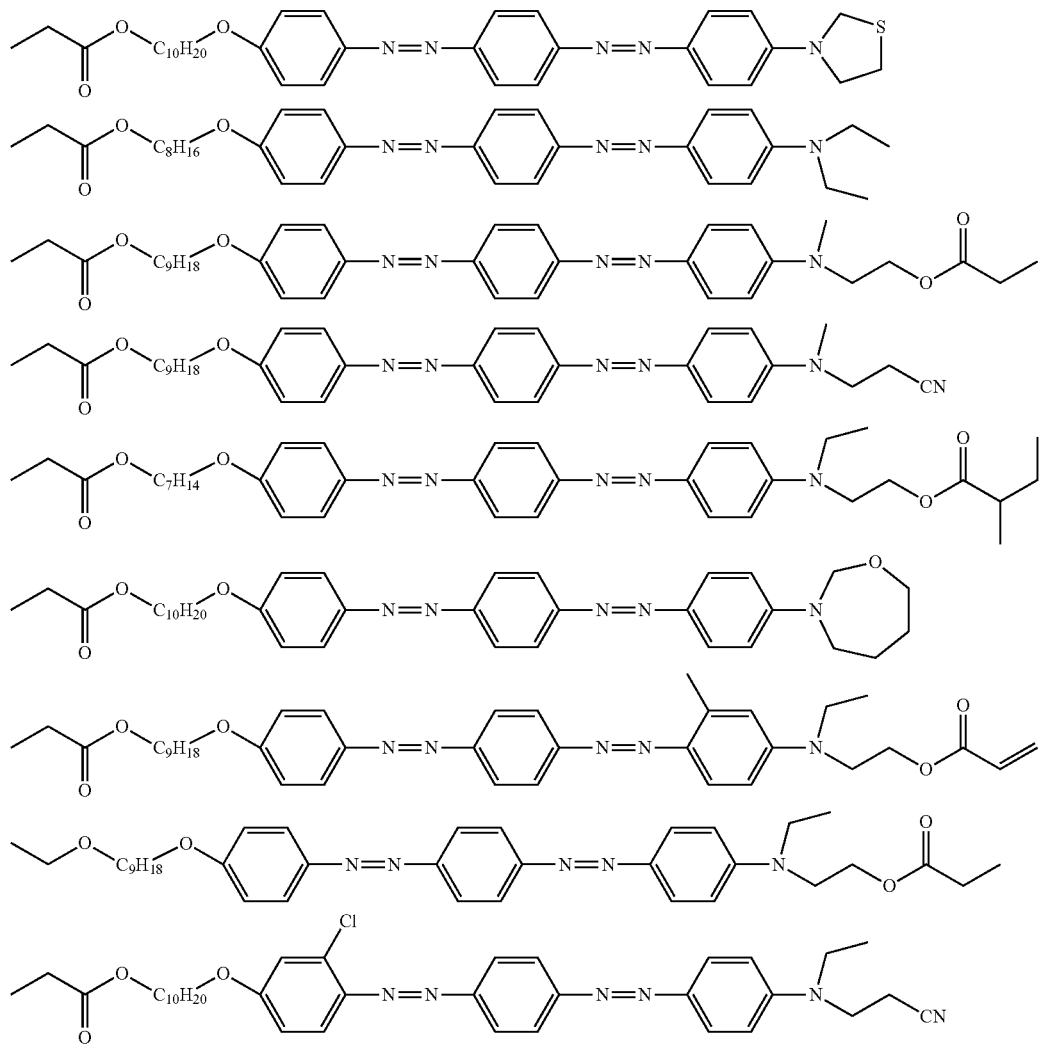

-continued
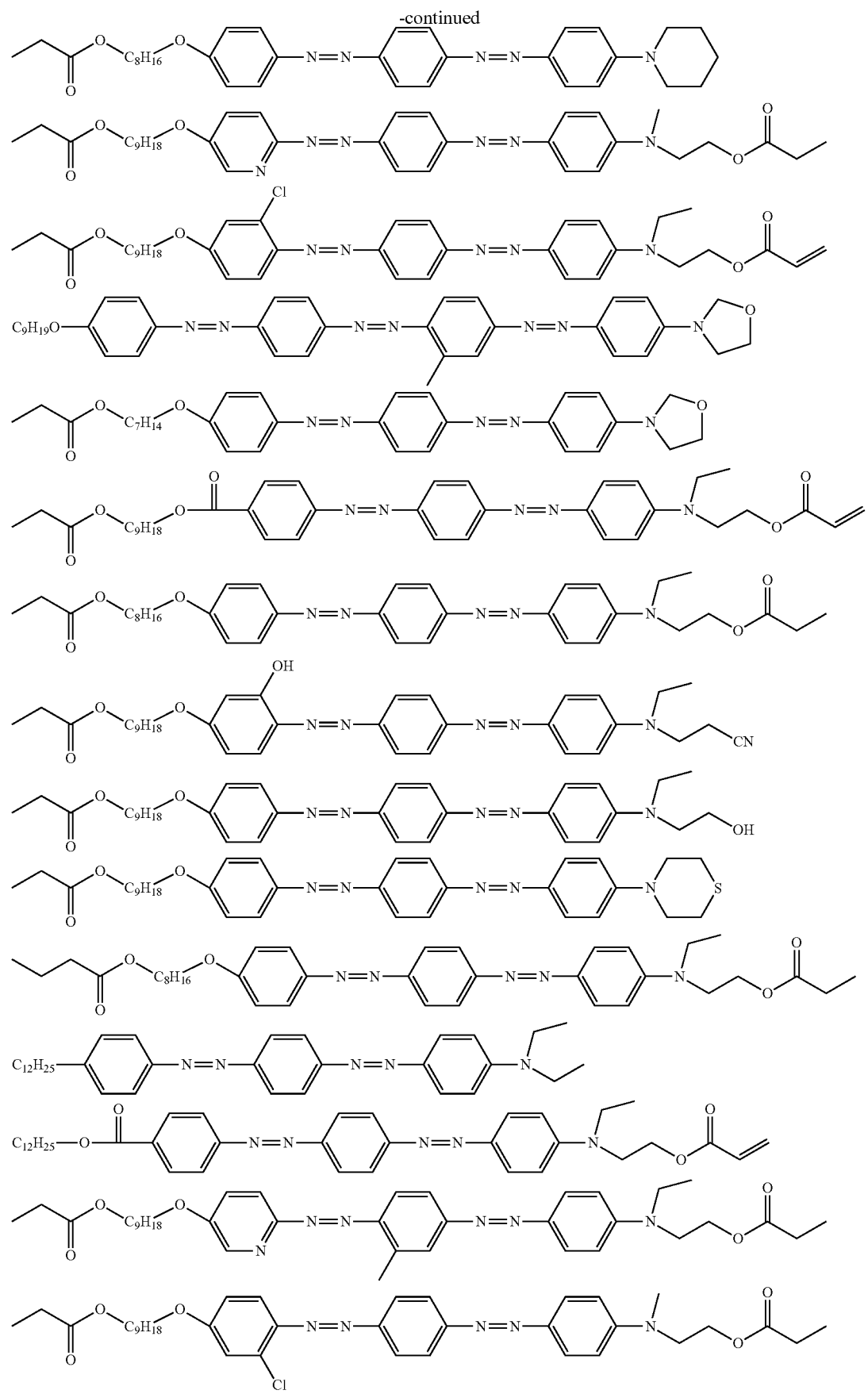

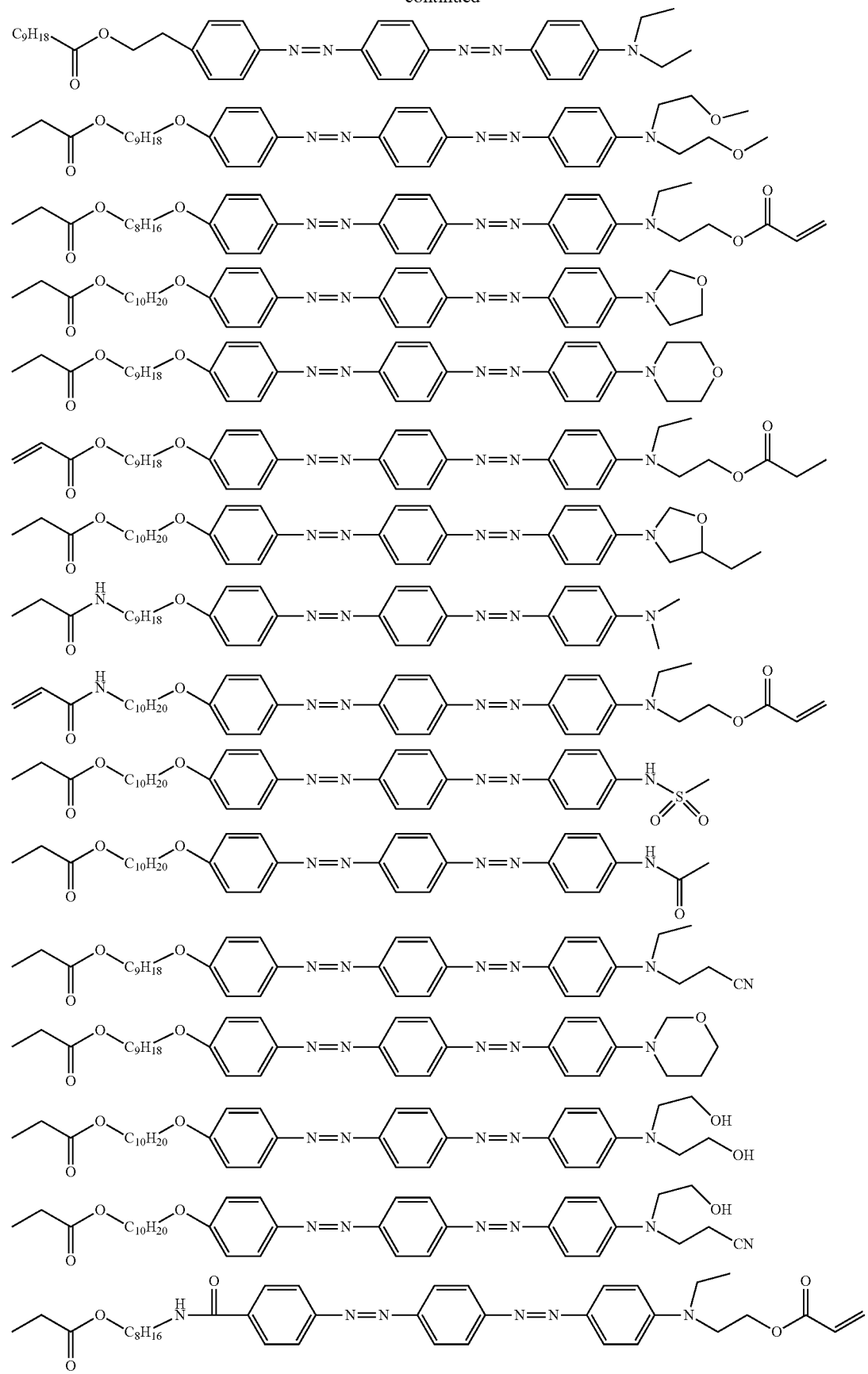

-continued

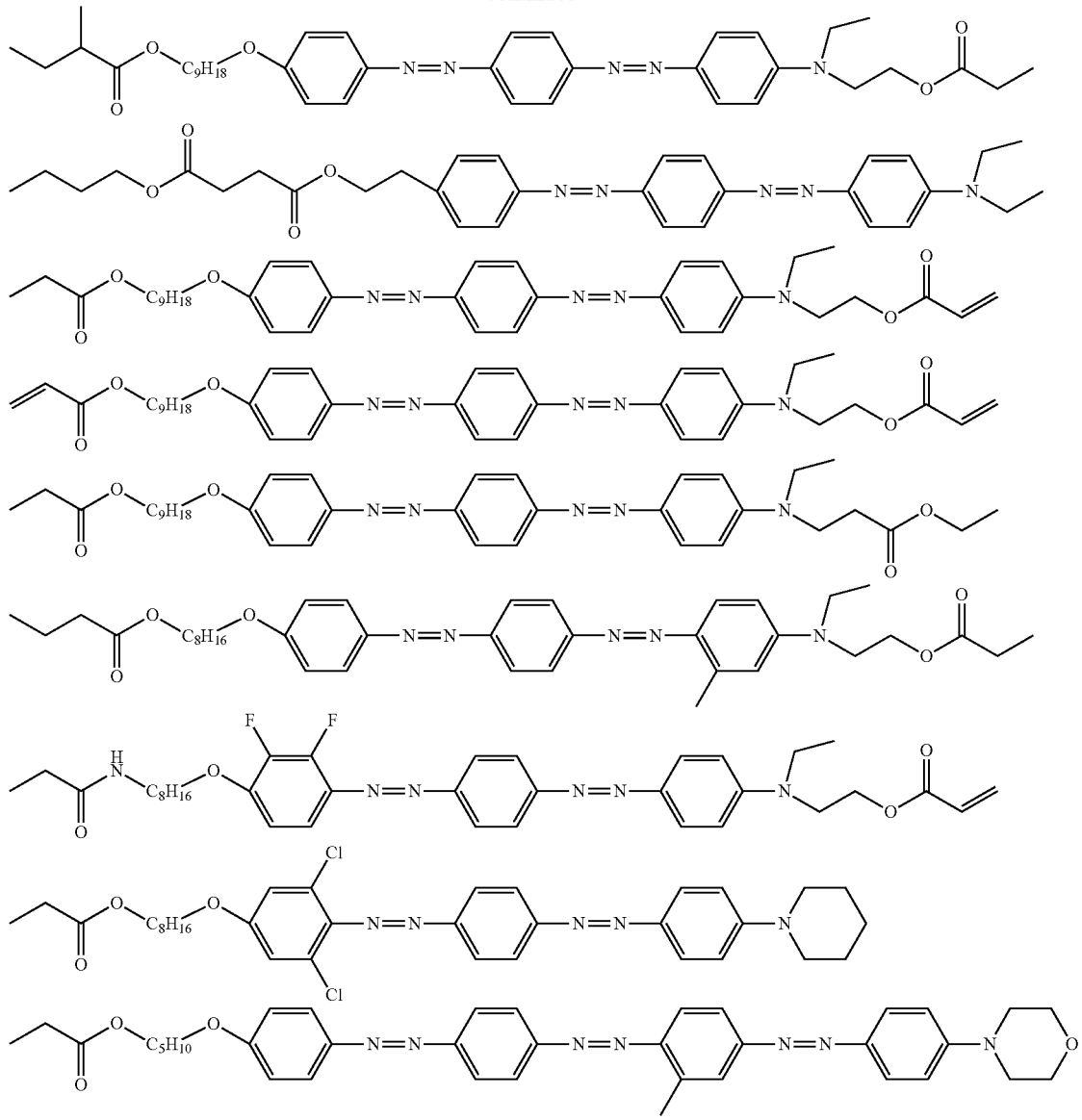

(Second Dichroic Azo Coloring Agent Compound)

The second dichroic azo coloring agent compound is a dichroic azo coloring agent compound other than the first dichroic azo coloring agent compound, and specifically, the second dichroic azo coloring agent compound has a chemical structure different from that of the first dichroic azo coloring agent compound.

The second dichroic azo coloring agent compound is a dichroic azo coloring agent compound having a maximum absorption wavelength in a wavelength range of 430 nm or greater and less than 500 nm, and from the viewpoint of adjusting the tint, preferably a dichroic azo coloring agent compound having a maximum absorption wavelength in a wavelength range of 440 to 490 nm and more preferably a dichroic azo coloring agent compound having a maximum absorption wavelength in a wavelength range of 450 to 480 nm.

It is preferable that the second dichroic azo coloring agent compound contains a dichroic azo coloring agent represented by Formula (6).

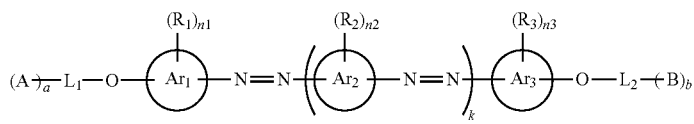

(6)

In Formula (6), A and B each independently represent a crosslinkable group.

In Formula (6), a and b each independently represent 0 or 1. From the viewpoint that the alignment degree at 420 nm is excellent, it is preferable that both a and b represent 0.

In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

In Formula (6), $Ar_1$ represents a (n1+2)-valent aromatic hydrocarbon group or a heterocyclic group, $Ar_2$ represents a (n2+2)-valent aromatic hydrocarbon group or a heterocyclic group, and $Ar_3$ represents a (n3+2)-valent aromatic hydrocarbon group or a heterocyclic group.

In Formula (6), $R_1$, $R_2$, and $R_3$ each independently represent a monovalent substituent. A plurality of $R_1$'s may be the same as or different from each other in a case of "n1≥2", a plurality of $R_2$'s may be the same as or different from each other in a case of "n2≥2", and a plurality of $R_3$'s may be the same as or different from each other in a case of "n3≥2".

In Formula (6), k represents an integer of 1 to 4. In a case of "k≥2", a plurality of $Ar_2$'s may be the same as or different from each other and a plurality of $R_2$'s may be the same as or different from each other.

In Formula (6), n1, n2, and n3 each independently represent an integer of 0 to 4. Here, an expression of "n1+n2+n3≥0" is satisfied in a case of "k=1", and an expression of "n1+n2+n3≥1" is satisfied in a case of "k≥2".

In Formula (6), examples of the crosslinkable group represented by A and B include the polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are more preferable from the viewpoint of further improving the solubility.

In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

As the monovalent substituent represented by $L_1$ and $L_2$, a group introduced to increase the solubility of the dichroic coloring agent compound or a group having an electron-donating property or an electron-withdrawing property which is introduced to adjust the color tone of the coloring agent is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an allyl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a furyl group, a piperidyl group, a morpholino group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a halogen atom (such as a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group.

These substituents may be further substituted with these substituents. Further, in a case where two or more substituents are present, these may be the same as or different from each other. Further, these may be bonded to each other to form a ring where possible.

As the group in which the above-described substituent is further substituted with the above-described substituent, an $R_B$—$(O$—$R_A)_{na}$— group which is a group in which an alkoxy group is substituted with an alkyl group is exemplified. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, and groups in which these groups are further substituted with these groups (for example, $R_B$—$(O$—$R_A)_{na}$— group) are preferable, an alkyl group, an alkoxy group, and groups in which these groups are further substituted with these groups (for example, an $R_B$—$(O$—$R_A)_{na}$— group) are more preferable.

Examples of the divalent linking group represented by $L_1$ and $L_2$ include —O—, —S—, —CO—, —COO—, —OCO—, —O—CO—O—, —CO—NRN—, —O—CO—NRN—, —NRN—CO—NRN—, —SO$_2$—, —SO—, an alkylene group, a cycloalkylene group, an alkenylene group, and a group obtained by combining two or more of these groups.

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same as or different from each other.

From the viewpoint of further improving the solubility of the dichroic coloring agent compound, the number of atoms in the main chain of at least one of $L_1$ or $L_2$ is preferably 3 or greater, more preferably 5 or greater, still more preferably 7 or greater, and particularly preferably 10 or greater. Further, the upper limit value of the number of atoms in the main chain is preferably 20 or less and more preferably 12 or less.

In addition, from the viewpoint of further improving the alignment degree of the light absorption anisotropic layer, the number of atoms of the main chain of at least one of $L_1$ or $L_2$ is preferably in a range of 1 to 5.

Here, in a case where A is present in Formula (6), "main chain" of $L_1$ denotes a portion required for directly linking "A" with the "O" atom linked to $L_1$, and "number of atoms in the main chain" denotes the number of atoms constituting the above-described portion. Similarly, in a case where B is present in Formula (6), "main chain" of $L_2$ denotes a portion required for directly linking "B" with the "0" atom linked to $L_2$, and "number of atoms in the main chain" denotes the number of atoms constituting the above-described portion. Further, "number of atoms in the main chain" does not include the number of atoms in a branched chain described below.

Further, in a case where A is not present, "number of atoms in the main chain" in $L_1$ denotes the number of atoms in $L_1$ that does not have a branched chain. In a case where B is not present, "number of atoms in the main chain" in $L_2$ denotes the number of atoms in $L_2$ that does not have a branched chain.

Specifically, in Formula (D1), the number of atoms in the main chain of $L_1$ is 5 (the number of atoms in the dotted frame on the left side of Formula (D1)), and the number of atoms in the main chain of $L_2$ is 5 (the number of atoms in the dotted frame on the right side of Formula (D1)). Further, in Formula (D10), the number of atoms in the main chain of $L_1$ is 7 (the number of atoms in the dotted frame on the left side of Formula (D10)), and the number of atoms in the main chain of $L_2$ is 5 (the number of atoms in the dotted frame on the right side of Formula (D10)).

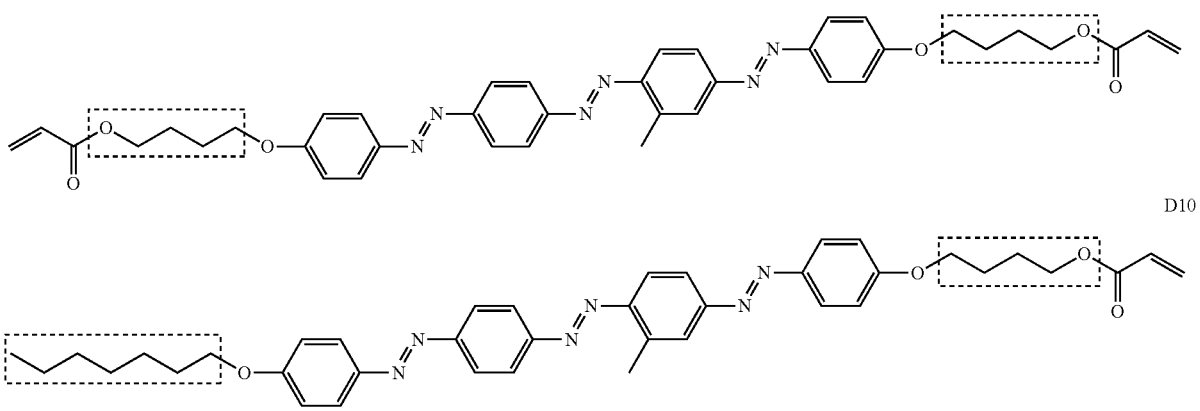

$L_1$ and $L_2$ may have a branched chain.

Here, in a case where A is present in Formula (6), "branched chain" of $L_1$ denotes a portion other than a portion required for directly linking "A" with the "O" atom linked to $L_1$ in Formula (6). Similarly, in a case where B is present in Formula (6), "branched chain" of $L_2$ denotes a portion other than a portion required for directly linking "B" with the "O" atom linked to $L_2$ in Formula (6).

Further, in a case where A is not present in Formula (6), "branched chain" of $L_1$ denotes a portion other than the longest atomic chain (that is, the main chain) extending from the "O" atom linked to $L_1$ in Formula (6) which is the starting point. Similarly, in a case where B is not present in Formula (6), "branched chain" of $L_2$ denotes a portion other than the longest atomic chain (that is, the main chain) extending from the "O" atom linked to $L_2$ in Formula (6) which is a starting point.

The number of atoms in the branched chain is preferably 3 or less. In a case where the number of atoms in the branched chain is set to 3 or less, there is an advantage that the alignment degree of the light absorption anisotropic layer is further improved. Further, the number of atoms in the branched chain does not include the number of hydrogen atoms.

In Formula (6), $Ar_1$ represents an (n1+2)-valent (for example, trivalent in a case where n1 represents 1) aromatic hydrocarbon group or heterocyclic group, $Ar_2$ represents an (n2+2)-valent (for example, trivalent in a case where n2 represents 1) aromatic hydrocarbon group or heterocyclic group, and $Ar_3$ represents an (n3+2)-valent (for example, trivalent in a case where n3 represents 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below).

The divalent aromatic hydrocarbon group represented by $Ar_1$ to $Ar_3$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group).

Specific examples of the divalent aromatic hydrocarbon group include a phenylene group, an azulene-diyl group, a naphthylene group, a fluorene-diyl group, an anthracene-diyl group, and a tetracene-diyl group. From the viewpoints of further improving the solubility, a phenylene group or a naphthylene group is preferable, and a phenylene group is more preferable.

Specific examples of the second dichroic coloring agent compound are shown below, but the present invention is not limited thereto. In the following specific examples, n represents an integer of 1 to 10.

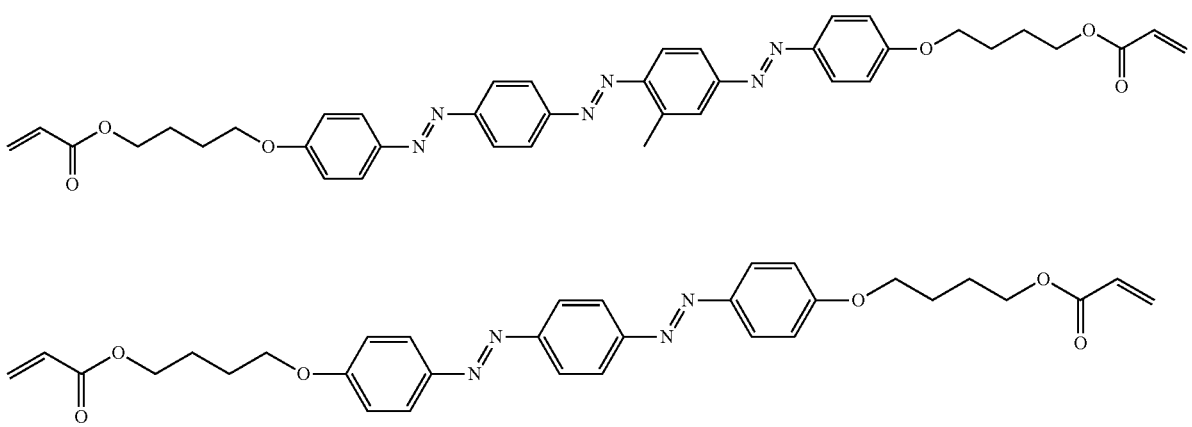

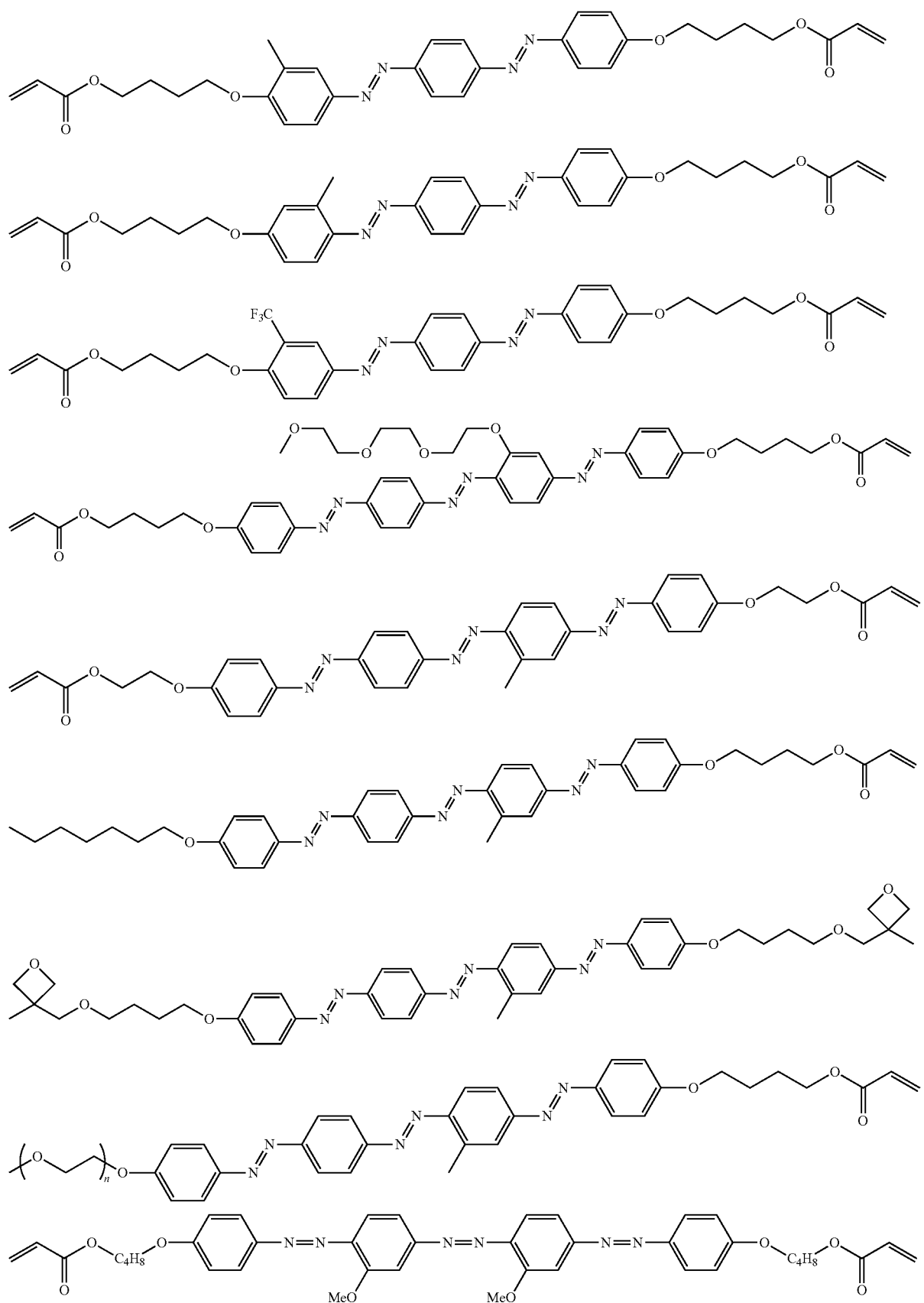

-continued

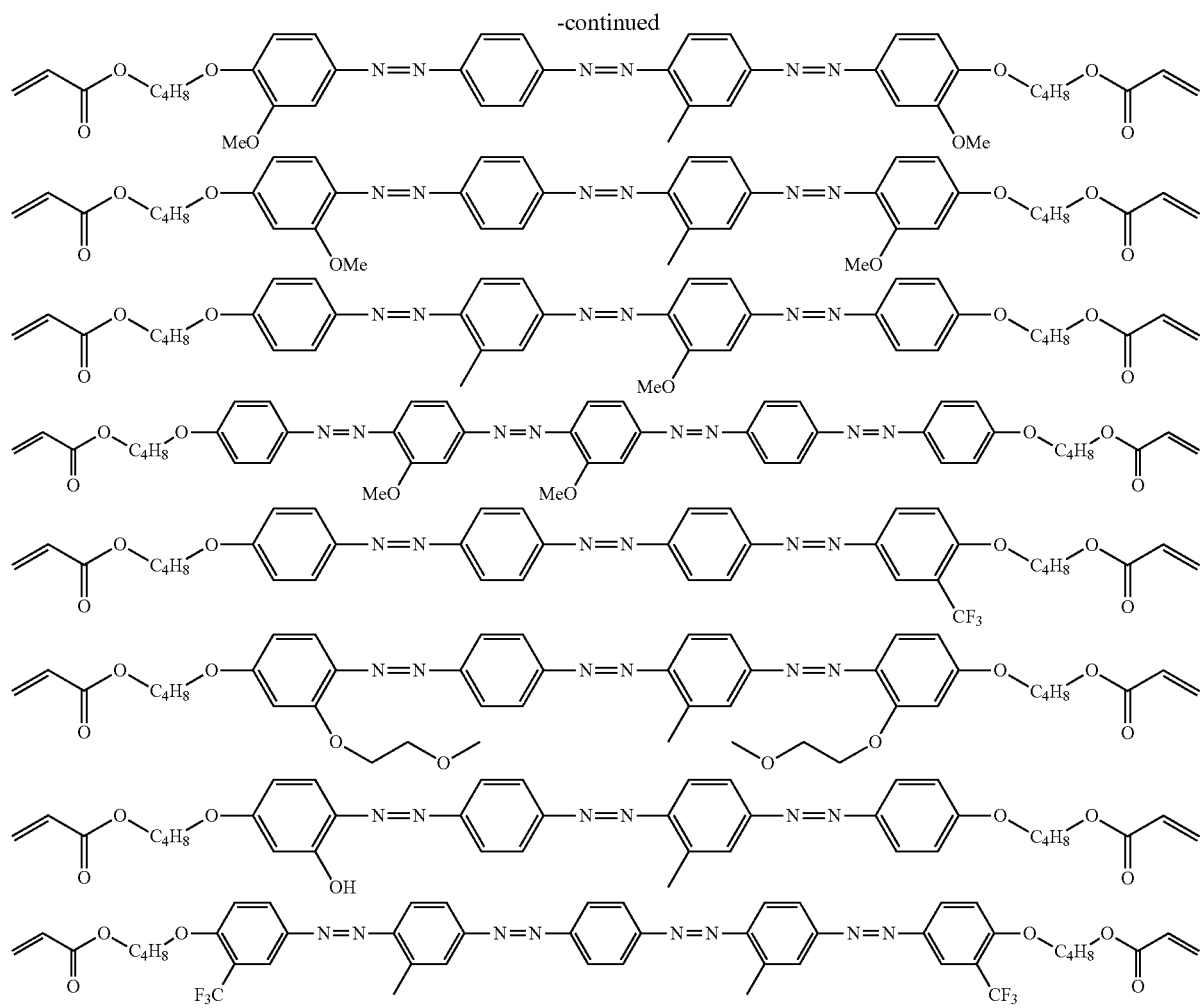

From the viewpoint that the alignment degree at 460 nm is excellent, a structure in which the second coloring agent does not contain a radically polymerizable group is preferable. Examples thereof include the following structures.

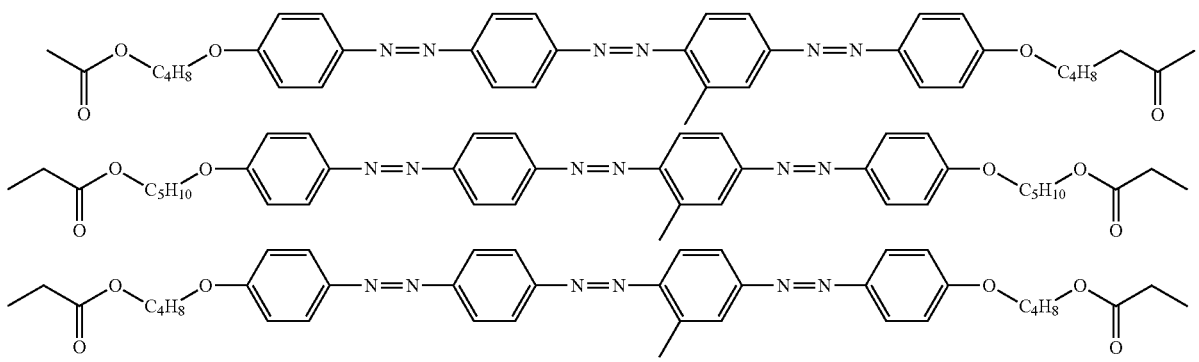

From the viewpoint that the alignment degree at 460 nm is particularly excellent, it is more preferable that the second dichroic azo coloring agent compound is a dichroic coloring agent compound having a structure represented by Formula (1-1).

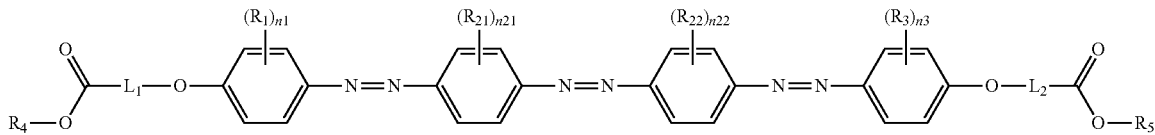

(1-1)

In Formula (1-1), $R_1$, $R_3$, $R_4$, $R_5$, n1, n3, $L_1$, and $L_2$ each have the same definition as that for $R_1$, $R_3$, $R_4$, $R_5$, n1, n3, $L_1$, and $L_2$ of Formula (3).

In Formula (1-1), $R_{21}$ and $R_{22}$ each independently have the same definition as that for R2 in Formula (3).

In Formula (1-1), n21 and n22 each independently have the same definition as that for n2 in Formula (3).

An expression of "n1+n21+n22+n3≥1" is satisfied, and "n1+n21+n22+n3" is preferably in a range of 1 to 9 and more preferably in a range of 1 to 5.

Specific examples of the second dichroic coloring agent compound are shown below, but the present invention is not limited thereto.

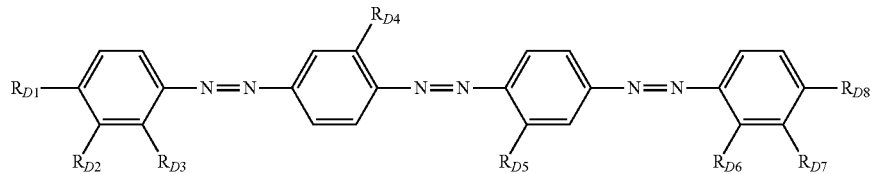

| No | $R_{D1}$ | $R_{D2}$ | $R_{D3}$ | $R_{D4}$ | $R_{D5}$ | $R_{D6}$ | $R_{D7}$ | $R_{D8}$ |
|---|---|---|---|---|---|---|---|---|
| D1 | $OC_4H_8C(O)OCH_2CH_3$ | H | H | H | $CH_3$ | H | H | $OC_4H_8C(O)OCH_2CH_3$ |
| D2 | $OC4H_8C(O)OCH_3$ | H | H | H | $CH_3$ | H | H | $OC_4H_8C(O)OCH_3$ |
| D3 | $OC_4H_8C(O)OCH_2CH_3$ | H | H | H | $CH_3$ | H | H | $OC_{11}H_{23}$ |
| D4 | $OC_4H_8C(O)OCH_2CH_3$ | H | H | H | $CH_3$ | H | H | $OC_5H_{11}$ |
| D5 | $OC_4H_8C(O)OCH_2CH_3$ | H | H | H | $CH_3$ | H | H | $OCH_2CH_3$ |
| D6 | $OC_4H_8C(O)OCH_2CH_3$ | H | H | H | $CH_3$ | H | Cl | $OC_4H_8C(O)OCH_2CH_3$ |
| D7 | $OC_3H_6C(O)OCH_2CH_3$ | H | H | H | $CH_3$ | H | H | $OC_3H_6C(O)OCH_2CH_3$ |
| D8 | $OC_3H_6C(O)OCH_2CH_3$ | H | H | Cl | H | Cl | H | $OC_3H_6C(O)OCH_2CH_3$ |
| D9 | $OC_9H_{18}C(O)OCH_2CH_3$ | H | H | H | $CH_3$ | H | H | $OC_9H_{18}C(O)OCH_2CH_3$ |
| D10 | $OC_4H_8C(O)OCH_2CH=CH_2$ | H | H | H | $CH_3$ | H | H | $OC_4H_8C(O)OCH_2CH=CH_2$ |
| D11 | $OC_4H_8C(O)OCH_2CH_3$ | H | H | H | Cl | H | H | $OC_4H_8C(O)OCH_2CH_3$ |
| D12 | $OC_6H_4C(O)OCH_2CH_3$ | H | H | H | $CH_3$ | H | H | $OC_6H_4C(O)OCH_2CH_3$ |

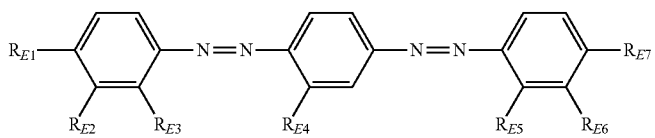

| No | $R_{E1}$ | $R_{E2}$ | $R_{E3}$ | $R_{E4}$ | $R_{E5}$ | $R_{E6}$ | $R_{E7}$ |
|---|---|---|---|---|---|---|---|
| E1 | $OC_4H_8C(O)OCH_2CH_3$ | H | H | H | H | H | $OC_4H_8C(O)OCH_2CH_3$ |
| E2 | $OC_4H_8C(O)OCH_3$ | H | H | H | H | H | $OC_4H_8C(O)OCH_3$ |
| E3 | $OC_4H_8C(O)OCH_2CH_3$ | Cl | H | H | H | Cl | $OC_4H_8C(O)OCH_2CH_3$ |
| E4 | $OC_4H_8C(O)OCH_2CH_3$ | H | H | H | H | Cl | $OC_5H_{11}$ |
| E5 | $OC_4H_8C(O)OCH_2CH_3$ | H | H | $CH_3$ | H | H | $OCH_3CH_3$ |
| E6 | $OC_3H_6C(O)OCH_2CH_3$ | H | H | H | H | H | $OC_3H_6C(O)OCH_2CH_3$ |
| E7 | $OC_9H_{18}C(O)OCH_2CH_3$ | H | H | H | H | H | $OC_9H_{18}C(O)OCH_2CH_3$ |
| E8 | $OC_4H_8C(O)OCH_2CH=CH_2$ | H | H | H | H | H | $OC_4H_8C(O)OCH_2CH=CH_2$ |

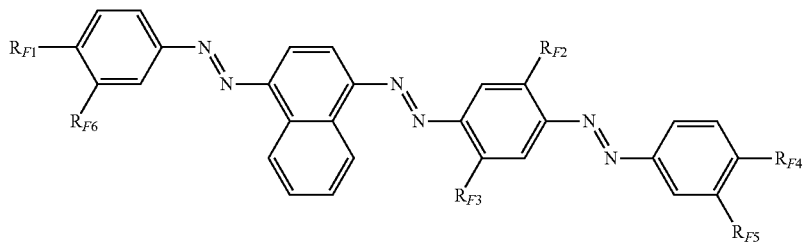

| No | $R_{F1}$ | $R_{F2}$ | $R_{F3}$ | $R_{F4}$ | $R_{F5}$ | $R_{F6}$ |
|---|---|---|---|---|---|---|
| F1 | $OC_4H_8C(O)OCH_2CH_3$ | H | H | $OC_4H_8C(O)OCH_2CH_3$ | H | H |
| F2 | $OC_4H_8C(O)OCH_3$ | H | $CH_3$ | $OC_4H_8C(O)OCH_3$ | H | H |
| F3 | $OC_3H_6C(O)OCH_2CH_3$ | H | H | $OC_3H_6C(O)OCH_2CH_3$ | H | Cl |

(Contents of Dichroic Coloring Agent Compound)

From the viewpoint of easily adjusting the alignment degree of the light absorption anisotropic layer to 0.7 or greater, the content of the dichroic coloring agent compound is preferably in a range of 5% to 30% by mass, more preferably in a range of 8% to 20% by mass, and still more preferably in a range of 10% to 15% by mass with respect to the total mass of the solid content of the light absorption anisotropic layer.

Further, from the viewpoint of easily adjusting the alignment degree of the light absorption anisotropic layer to 0.7 or greater, the content of the first dichroic azo coloring agent compound is preferably in a range of 30% to 80% by mass and more preferably in a range of 40% to 70% by mass with respect to the total mass of the entire dichroic coloring agent compound in the light absorption anisotropic layer.

From the viewpoint of easily adjusting the alignment degree of the light absorption anisotropic layer to 0.7 or greater, the content of the second dichroic azo coloring agent compound is preferably in a range of 20% to 70% by mass and more preferably in a range of 30% to 60% by mass with respect to the total mass of the entire dichroic coloring agent compound in the light absorption anisotropic layer.

<Liquid Crystal Compound>

It is preferable that the light absorption anisotropic layer contains a liquid crystal compound. In a case where the light absorption anisotropic layer contains a liquid crystal compound, the dichroic coloring agent compound can be aligned with a high alignment degree while the precipitation of the dichroic coloring agent compound is suppressed.

The liquid crystal compound is a liquid crystal compound that does not exhibit dichroism.

As the liquid crystal compound, any of a low-molecular-weight liquid crystal compound or a polymer liquid crystal compound can also be used, and it is preferable that both are used in combination. Here, "low-molecular-weight liquid crystal compound" indicates a liquid crystal compound having no repeating units in the chemical structure. Here, "polymer liquid crystal compound" indicates a liquid crystal compound having a repeating unit in the chemical structure.

Examples of the low-molecular-weight liquid crystal compound include liquid crystal compounds described in JP2013-228706A.

Examples of the polymer liquid crystal compound include thermotropic liquid crystal polymers described in JP2011-237513A. Further, from the viewpoint that the strength (particularly, the bending resistance) of the light absorption anisotropic film is excellent, it is preferable that the polymer liquid crystal compound has a repeating unit containing a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In a case where the light absorption anisotropic layer contains a polymer liquid crystal compound, it is preferable that the polymer liquid crystal compound forms a nematic liquid crystal phase.

The temperature at which the nematic liquid crystal phase is exhibited is preferably in a range of room temperature (23° C.) to 450° C. and preferably in a range of 50° C. to 400° C. from the viewpoints of handleability and manufacturing suitability.

The content of the liquid crystal compound is preferably in a range of 25 to 2,000 parts by mass, more preferably in a range of 100 to 1,300 parts by mass, and still more preferably in a range of 200 to 900 parts by mass with respect to 100 parts by mass of the content of the dichroic coloring agent compound in the liquid crystal composition. In a case where the content of the liquid crystal compound is in the above-described range, the alignment degree of the polarizer is further improved.

The liquid crystal composition may contain only one or two or more kinds of liquid crystal compounds. In a case where the light absorption anisotropic layer contains two or more kinds of liquid crystal compounds, the content of the liquid crystal compounds denotes the total content of the liquid crystal compounds.

From the viewpoint that the alignment degree is more excellent, it is preferable that the liquid crystal compound is a polymer liquid crystal compound having a repeating unit represented by Formula (1L) (hereinafter, also referred to as "repeating unit (1L)").

(1L)

In Formula (1L), P1 represents the main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

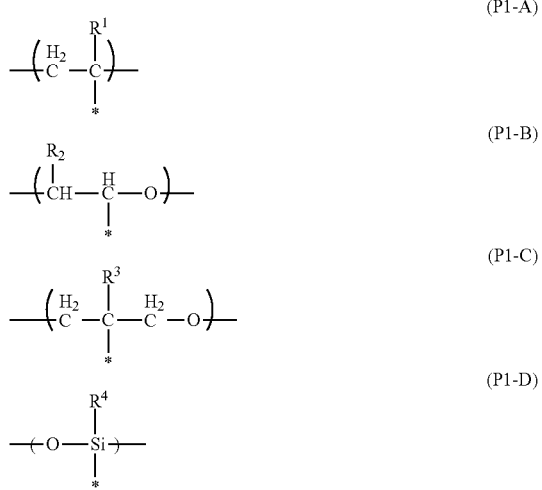

In Formulae (P1-A) to (P1-D), "*" represents a bonding position with respect to L1 in Formula (1L). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^4(OR^5)_2$—. In the formula, $R^4$ has the same definition as that for $R^4$ in Formula (P1-D), and a plurality of $R^5$'s each independently represent a hydrogen atom or an alkyl group having 1 to 10 carbon atoms.

L1 represents a single bond or a divalent linking group. Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent W (described below).

In a case where P1 represents a group represented by Formula (P1-A), from the viewpoint that the alignment degree is more excellent, it is preferable that L1 represents a group represented by —C(O)O—.

In a case where P1 represents a group represented by any of Formulae (P1-B) to (P1-D), from the viewpoint that the alignment degree is more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—$(CH_2—CH_2O)_{n1}$—* is preferable. In the formula, n1 represents an integer of 1 to 20, and "*" represents a bonding position with respect to L1 or M1 in Formula (1L). From the viewpoint that the alignment degree is more excellent, n1 represents preferably an integer of 2 to 10, more preferably an integer of 2 to 4, and most preferably an integer of 3.

Further, from the viewpoint that the alignment degree is more excellent, a group represented by *—$(CH(CH_3)—CH_2O)_{n2}$—* is preferable as the oxypropylene structure represented by SP1. In the formula, n2 represents an integer of 1 to 3, and "*" represents a bonding position with respect to L1 or M1.

Further, from the viewpoint that the alignment degree is more excellent, a group represented by *—$(Si(CH_3)_2—O)_{n3}$—* is preferable as the polysiloxane structure represented by SP1. In the formula, n3 represents an integer of 6 to 10, and "*" represents a bonding position with respect to L1 or M1.

Further, from the viewpoint that the alignment degree is more excellent, a group represented by *—$(CF_2—CF_2)_{n4}$—* is preferable as the alkylene fluoride structure represented by SP1. In the formula, n4 represents an integer of 6 to 10, and "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited, and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystal Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint that the alignment degree is more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the alignment degree is more excellent, a group represented by Formula (M1-A) or Formula (M1-B) is preferable, and a group represented by Formula (M1-B) is more preferable as the mesogen group.

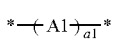  (M1-A)

  (M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent W described below.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the alignment degree is more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the alignment degree is more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, —C(O)O— is preferable from the viewpoint that the alignment degree is more excellent. LA1 may represent a group obtained by combining two or more of these groups.

Specific examples of M1 include the following structures. In the following specific examples, "Ac" represents an acetyl group.

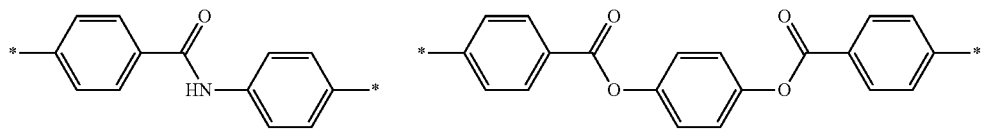

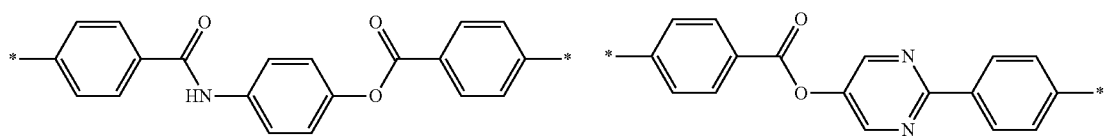

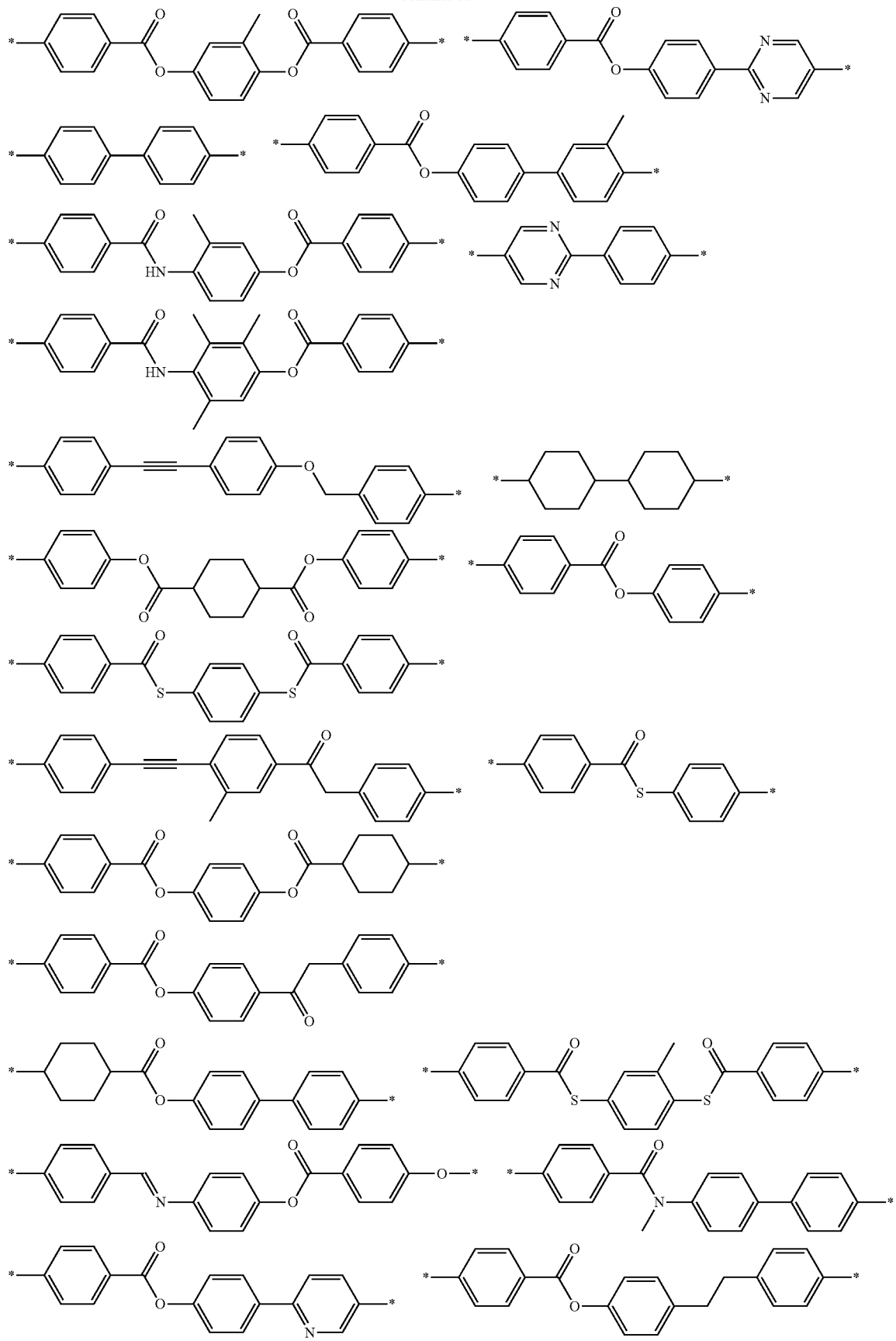

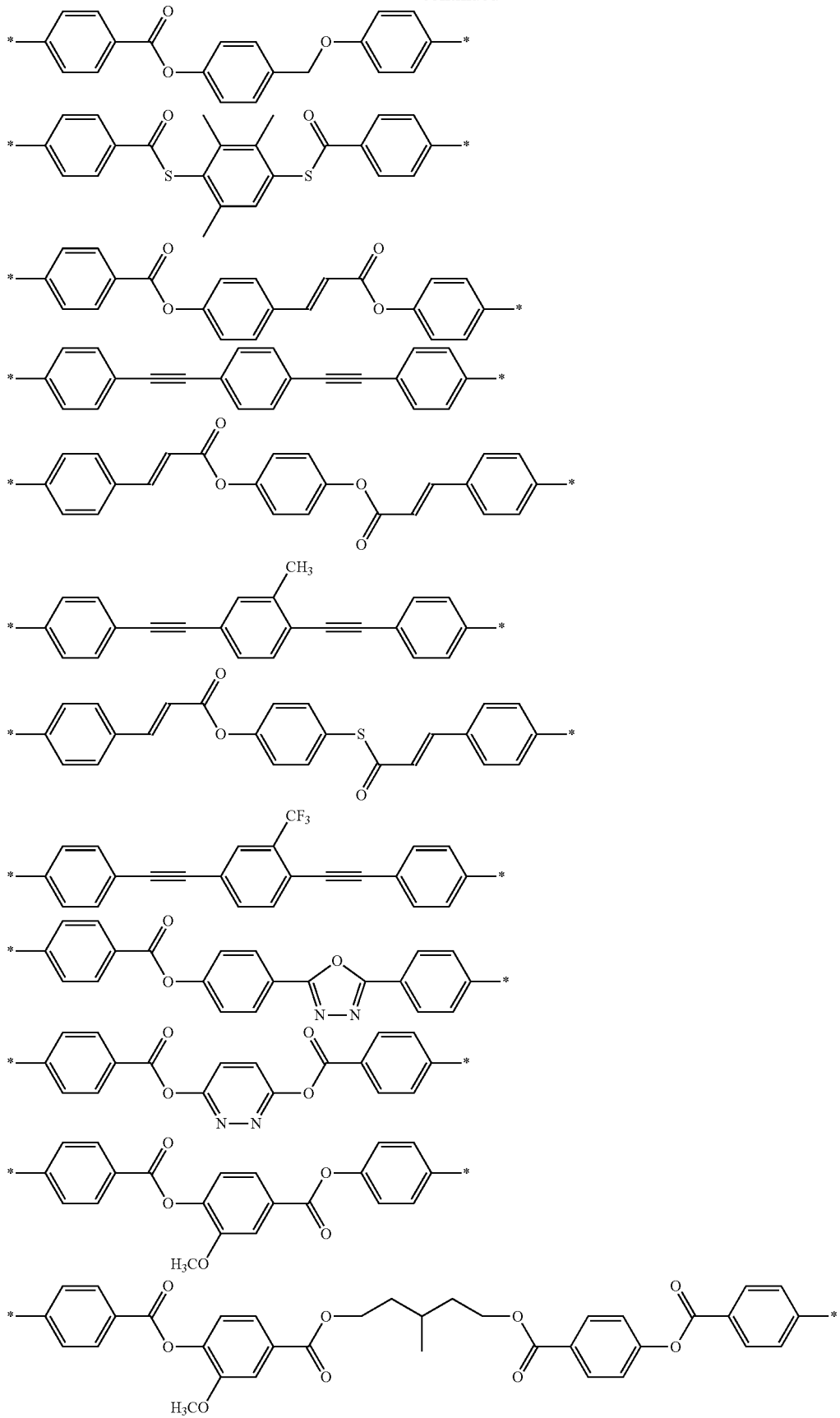

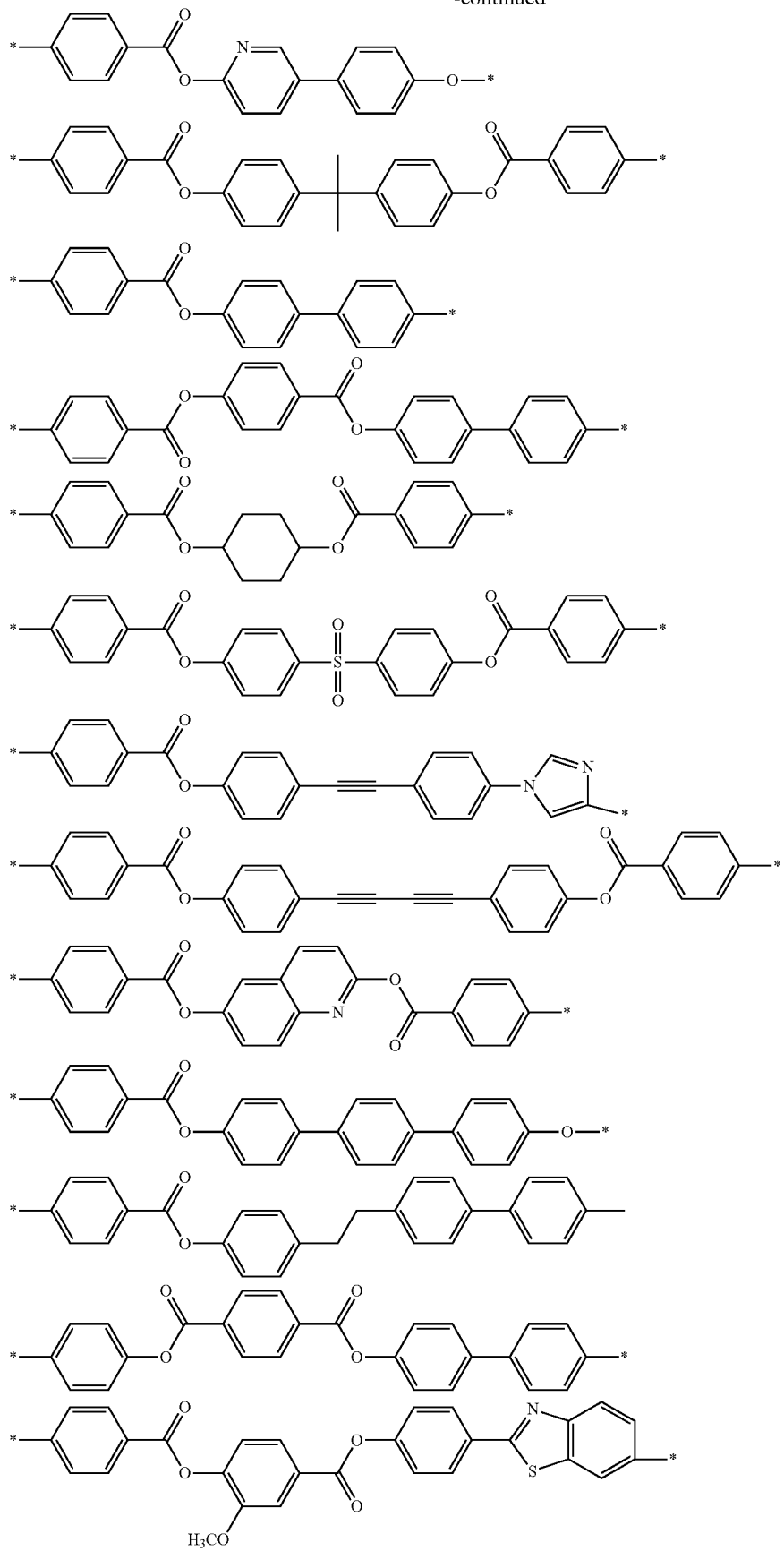

-continued
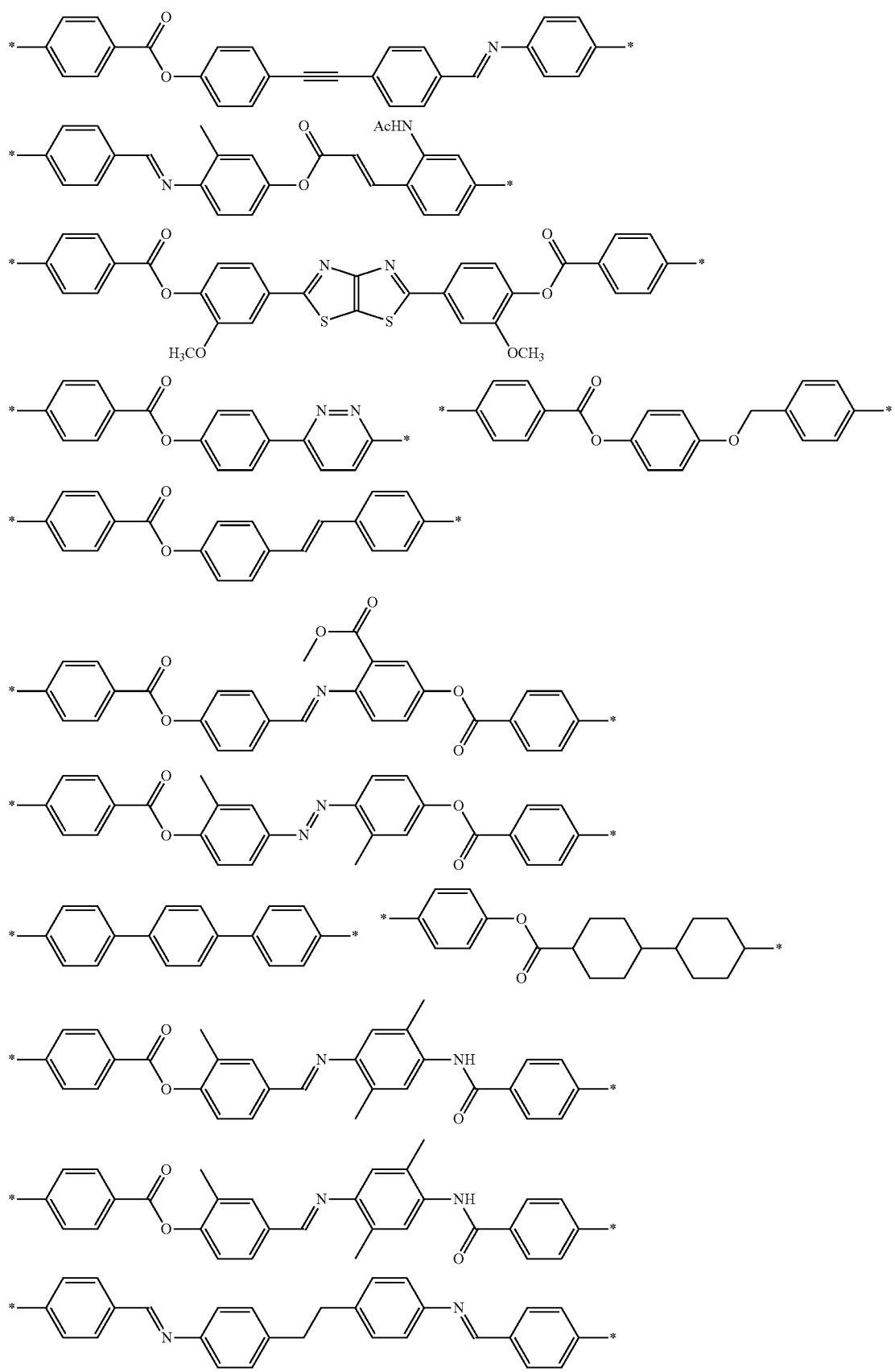

-continued

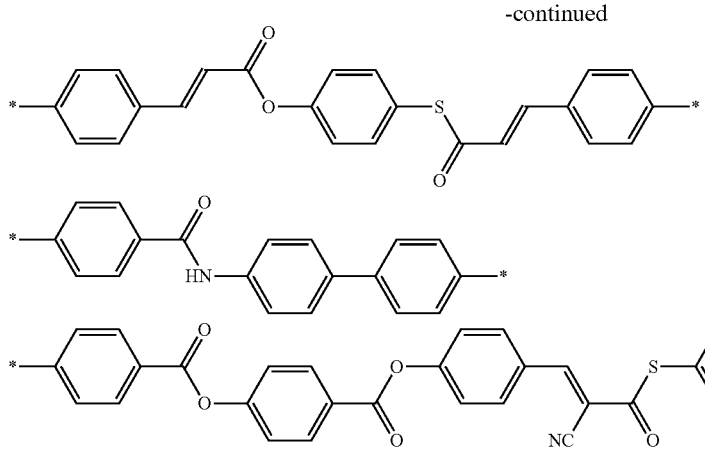

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group. Specific examples of the linking group are the same as those of L1 and SP1 described above. A represents a (meth)acryloyloxy group).

From the viewpoint that the alignment degree is more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the above-described cross-linkable groups.

From the viewpoint that the alignment degree is more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree of the polarizer is further improved. Here, "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint that the alignment degree is more excellent, the content is preferably in a range of 20% to 100% by mass with respect to 100% by mass of all the repeating units contained in the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of repeating units (1L). Among these, from the viewpoint that the alignment degree is more excellent, the polymer liquid crystal compound may have two kinds of the repeating units (1L).

In a case where the polymer liquid crystal compound has two kinds of the repeating units (1L), from the viewpoint that the alignment degree is more excellent, it is preferable that the terminal group represented by T1 in one (repeating unit A) is an alkoxy group and the terminal group represented by T1 in the other (repeating unit B) is a group other than the alkoxy group.

From the viewpoint that the alignment degree is more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the alignment degree is more excellent, the ratio (AB) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

Further, the polymer liquid crystal compound may have the repeating unit (1L) and a repeating unit containing no mesogen group. Examples of the repeating unit containing no mesogen group include a repeating unit in which M1 in Formula (1L) represents a single bond.

In a case where the polymer liquid crystal compound has a repeating unit containing no mesogen group, from the viewpoint that the alignment degree is more excellent, the content of the repeating unit is preferably greater than 0% by mass and 30% by mass or less and more preferably greater than 10% by mass and 20% by mass or less with respect to 100% by mass of all repeating units of the polymer liquid crystal compound.

(Weight-Average Molecular Weight)

From the viewpoint that the alignment degree is more excellent, the weight-average molecular weight (Mw) of the polymer liquid crystal compound is preferably in a range of 1,000 to 500,000 and more preferably in a range of 2,000 to 300,000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10,000 or greater and more preferably in a range of 10,000 to 300,000.

In addition, from the viewpoint of the temperature latitude of the alignment degree, the weight-average molecular weight (Mw) of the polymer liquid crystal compound is preferably less than 10,000 and more preferably 2,000 or greater and less than 10,000.

Here, the weight-average molecular weight and the number average molecular weight in the present invention are values measured by the gel permeation chromatography (GPC) method.

Solvent (eluent): N-methylpyrrolidone
Device name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2,800,000 to 1,050 (Mw/Mn=1.03 to 1.06) are used.

The substituent W in the present specification will be described.

Examples of the substituent W include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfonic acid group, and a phosphoric acid group.

The light absorption anisotropic layer can be prepared by using a composition for forming a light absorption anisotropic layer, which contains the above-described dichroic coloring agent compound and an optional liquid crystal compound.

The composition for forming a light absorption anisotropic layer may contain components other than the dichroic coloring agent compound and the liquid crystal compound, and examples thereof include a solvent, a vertical alignment agent, an interface improver, a polymerizable component, and a polymerization initiator (such as a radical polymerization initiator).

<Solvent>

From the viewpoint of workability or the like, it is preferable that the composition for forming a light absorption anisotropic layer contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tetrahydropyran, and dioxolane), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, ketones (particularly cyclopentanone and cyclohexanone), ethers (particularly tetrahydrofuran, cyclopentyl methyl ether, tetrahydropyran, and dioxolane), and amides (particularly dimethylformamide, dimethylacetamide, N-methylpyrrolidone, and M-ethylpyrrolidone) are preferable.

In a case where the composition for forming a light absorption anisotropic layer contains a solvent, the content of the solvent is preferably in a range of 80% to 99% by mass, more preferably in a range of 83% to 98% by mass, and still more preferably in a range of 85% to 96% by mass with respect to the total mass of the composition for forming a light absorption anisotropic layer.

In a case where the liquid crystal composition contains two or more kinds of solvents, the content of the solvent indicates the total content of the solvents.

<Interface Improver>

As the interface improver, the interface improver described in the columns of the examples described below can be used.

In a case where the composition for forming a light absorption anisotropic layer contains an interface improver, the content of the interface improver is preferably in a range of 0.001 to 5 parts by mass with respect to 100 parts by mass of the total amount of the dichroic coloring agent compound and the liquid crystal compound in the composition for forming a light absorption anisotropic layer.

<Polymerizable Component>

Examples of the polymerizable component include a compound containing an acrylate (such as an acrylate monomer). In this case, the light absorption anisotropic layer according to the embodiment of the present invention contains a polyacrylate obtained by polymerizing the compound containing an acrylate.

Examples of the polymerizable component include the compounds described in paragraph 0058 of JP2017-122776A.

In a case where the composition for forming a light absorption anisotropic layer contains a polymerizable component, the content of the polymerizable component is preferably in a range of 3 to 20 parts by mass with respect to 100 parts by mass of the total amount of the dichroic coloring agent compound and the liquid crystal compound in the composition for forming a light absorption anisotropic layer.

<Vertical Alignment Agent>

Examples of the vertical alignment agent include a boronic acid compound and an onium salt.

As the boronic acid compound, a compound represented by Formula (30) is preferable.

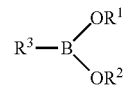

Formula (30)

In Formula (30), $R^1$ and $R^2$ each independently represent a hydrogen atom, a substituted or unsubstituted aliphatic hydrocarbon group, a substituted or unsubstituted aryl group, or a substituted or unsubstituted heterocyclic group.

$R^3$ represents a substituent containing a (meth)acryl group.

Specific examples of the boronic acid compound include a boronic acid compound represented by General Formula (I) described in paragraphs 0023 to 0032 of JP2008-225281A.

As the boronic acid compound, compounds shown below are also preferable.

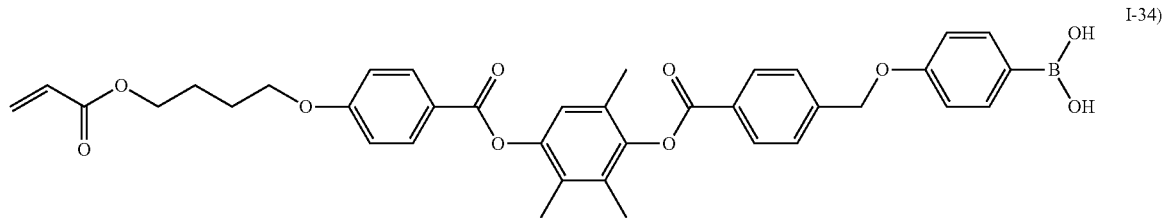

I-34)

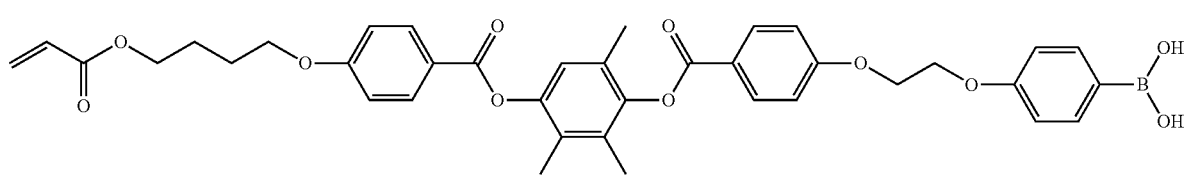

I-35)

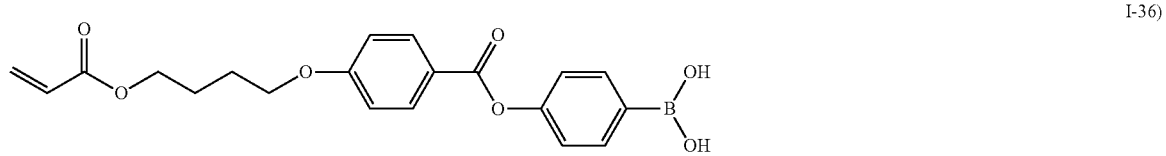

I-36)

As the onium salt, a compound represented by Formula (31) is preferable.

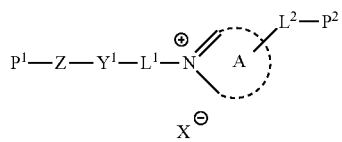

Formula (31)

In Formula (31), the ring A represents a quaternary ammonium ion consisting of a nitrogen-containing heterocyclic ring. X represents an anion. $L^1$ represents a divalent linking group. $L^2$ represents a single bond or a divalent linking group. $Y^1$ represents a divalent linking group having a 5- or 6-membered ring as a partial structure. Further, Z represents a divalent linking group containing an alkylene group having 2 to 20 carbon atoms as a partial structure. $P^1$ and $P^2$ each independently represent a monovalent substituent having a polymerizable ethylenically unsaturated bond.

Specific examples of the onium salt include the onium salts described in paragraphs 0052 to 0058 of JP2012-208397A, the onium salts described in paragraphs 0024 to 0055 of JP2008-026730A, the onium salts described in JP2002-37777A, and the onium salts described in paragraphs 0153 to 0171 of JP2020-076920A.

The content of the vertical alignment agent in the composition for forming a light absorption anisotropic layer is preferably in a range of 0.1% to 400% by mass and more preferably in a range of 0.5% to 350% by mass with respect to the total mass of the liquid crystal compound.

The vertical alignment agent may be used alone or in combination of two or more kinds thereof. In a case where two or more kinds of vertical alignment agents are used, the total amount thereof is preferably in the above-described ranges.

(Leveling Agent Suitable for Vertical Alignment)

In a case of vertical alignment, it is preferable that the composition contains a leveling agent described below. In a case where the composition contains a leveling agent, surface roughness due to drying air applied to the surface of the light absorption anisotropic layer is suppressed, and the dichroic coloring agent compound is more uniformly aligned.

The leveling agent is not particularly limited, and a leveling agent having a fluorine atom (fluorine-based leveling agent) or a leveling agent having a silicon atom (silicon-based leveling agent) is preferable, and a fluorine-based leveling agent is more preferable.

Examples of the fluorine-based leveling agent include fatty acid esters of polyvalent carboxylic acids, in which a part of a fatty acid is substituted with a fluoroalkyl group, and polyacrylates having a fluoro substituent. Particularly, in a case where a rod-like compound is used as the dichroic coloring agent compound and the liquid crystal compound, a leveling agent having a repeating unit derived from a compound represented by Formula (40) is preferable from the viewpoint of promoting the vertical alignment of the dichroic coloring agent compound and the liquid crystal compound.

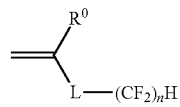

Formula (40)

$R^0$ represents a hydrogen atom, a halogen atom, or a methyl group.

L represents a divalent linking group. It is preferable that L represents an alkylene group having 2 to 16 carbon atoms, and optional —$CH_2$— that is not adjacent to the alkylene group may be substituted with —O—, —COO—, —CO—, or —CONH—.

n represents an integer of 1 to 18.

The leveling agent having a repeating unit derived from a compound represented by Formula (40) may further have other repeating units.

Examples of the other repeating units include a repeating unit derived from a compound represented by Formula (41).

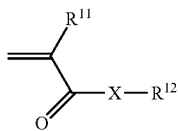

Formula (41)

$R^{11}$ represents a hydrogen atom, a halogen atom, or a methyl group.

X represents an oxygen atom, a sulfur atom, or —N($R^{13}$)—. $R^{13}$ represents a hydrogen atom or an alkyl group having 1 to 8 carbon atoms.

$R^{12}$ represents a hydrogen atom, an alkyl group which may have a substituent, or an aromatic group which may have a substituent. The number of carbon atoms of the alkyl group is preferably in a range of 1 to 20. The alkyl group may be linear, branched chain-like, or cyclic.

Further, examples of the substituent that the alkyl group may have include a poly(alkyleneoxy) group and a polymerizable group. The definition of the polymerizable group is as described above.

In the case where the leveling agent has a repeating unit derived from a compound represented by Formula (40) and a repeating unit derived from a compound represented by Formula (41), the content of the repeating unit derived from the compound represented by Formula (40) is preferably in a range of 10% to 90% by mole and more preferably in a range of 15% to 95% by mole with respect to all the repeating units of the leveling agent.

In the case where the leveling agent has a repeating unit derived from a compound represented by Formula (40) and a repeating unit derived from a compound represented by Formula (41), the content of the repeating unit derived from the compound represented by Formula (41) is preferably in a range of 10% to 90% by mole and more preferably in a range of 5% to 85% by mole with respect to all the repeating units of the leveling agent.

Further, examples of the leveling agent include a leveling agent having a repeating unit derived from a compound represented by Formula (42) in place of the repeating unit derived from a compound represented by Formula (40).

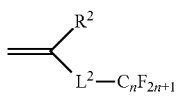

Formula (42)

$R^2$ represents a hydrogen atom, a halogen atom, or a methyl group.

$L_2$ represents a divalent linking group.

n represents an integer of 1 to 18.

Specific examples of the leveling agent include the compounds described in paragraphs 0046 to 0052 of JP2004-331812A and the compounds described in paragraphs 0038 to 0052 of JP2008-257205A.

The content of the leveling agent in the composition for forming a light absorption anisotropic layer is preferably in a range of 0.001% to 10% by mass and more preferably in a range of 0.01% to 5% by mass with respect to the total mass of the liquid crystal compound.

The leveling agent may be used alone or in combination of two or more kinds thereof. In a case where two or more leveling agents are used, it is preferable that the total amount thereof is in the above-described ranges.

<Polymerization Initiator>

It is preferable that the composition for forming a light absorption anisotropic layer contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-560-105667A) and U.S. Pat. No. 4,239,850A), oxadiazole compounds (U.S. Pat. No. 4,212,970A), o-acyloxime compounds (paragraph [0065] of JP2016-27384A), and acylphosphine oxide compounds (JP1988-40799B (JP-563-40799B), JP1993-29234B (JP-H5-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the composition for forming a light absorption anisotropic layer contains a polymerization initiator, the content of the polymerization initiator is preferably in a range of 0.01 to 30 parts by mass and more preferably in a range of 0.1 to 15 parts by mass with respect to 100 parts by mass of the total amount of the dichroic coloring agent compound and the polymer liquid crystal compound in the composition for forming a light absorption anisotropic layer. The durability of the light absorption anisotropic film is enhanced in a case where the content of the polymerization initiator is 0.01 parts by mass or greater, and the alignment degree of the light absorption anisotropic film is enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

<Method of Forming Light Absorption Anisotropic Layer>

The method for forming the light absorption anisotropic layer is not particularly limited, and examples thereof include a method of sequentially performing a step of applying the composition for forming a light absorption anisotropic layer described above to form a coating film (hereinafter, also referred to as "coating film forming step") and a step of aligning liquid crystal components and dichroic coloring agent compounds contained in the coating film (hereinafter, also referred to as "aligning step").

Further, the liquid crystal component is a component that also includes a dichroic coloring agent compound having liquid crystallinity in a case where the above-described dichroic coloring agent compound has liquid crystallinity, in addition to the above-described liquid crystal compound.

(Coating Film Forming Step)

The coating film forming step is a step of applying a composition for forming a light absorption anisotropic layer to form a coating film.

The composition for forming a light absorption anisotropic layer can be easily applied by using the composition for forming a light absorption anisotropic layer which contains the above-described solvent or using a liquid such as a melt obtained by heating the composition for forming a light absorption anisotropic layer.

Specific examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Aligning Step)

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal components contained in the composition for forming a light absorption anisotropic layer may be aligned by the coating film forming step or the drying treatment described above. For example, in an embodiment in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C.

Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal components contained in the coating film can be fixed. The cooling means is not particularly limited and can be performed according to a known method.

The light absorption anisotropic film can be obtained by performing the above-described steps.

In the present aspect, examples of the method of aligning the liquid crystal components contained in the coating film include a drying treatment and a heat treatment, but the method is not limited thereto, and the liquid crystal components can be aligned by a known alignment treatment.

(Other Steps)

The method of forming the light absorption anisotropic layer may include a step of curing the light absorption anisotropic layer after the aligning step (hereinafter, also referred to as "curing step").

The curing step is performed by heating the light absorption anisotropic layer and/or irradiating the layer with light (exposing the layer to light), for example, in a case where the light absorption anisotropic layer contains a crosslinkable group (polymerizable group). Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

In a case where the exposure is performed while the layer is heated, the heating temperature during the exposure depends on the transition temperature of the liquid crystal components contained in the liquid crystal film to a liquid crystal phase, but is preferably in a range of 25° to 140° C.

Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

The thickness of the light absorption anisotropic layer is not particularly limited, but is preferably in a range of 100 to 8,000 nm and more preferably in a range of 300 to 5,000 nm from the viewpoint of the flexibility in a case where the laminate according to the embodiment of the present invention is used in a polarizer.

[Transparent Base Film]

The optical film according to the embodiment of the present invention may include a transparent base film.

It is preferable that the transparent base film is disposed on a surface of the light absorption anisotropic layer opposite to the surface on which the optical film is provided.

As the transparent base film, a known transparent resin film, a known transparent resin plate, a known transparent resin sheet, or the like can be used without particular limitation. Examples of the transparent resin film include a cellulose acylate film (such as a cellulose triacetate film (refractive index of 1.48), a cellulose diacetate film, a cellulose acetate butyrate film, or a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth)acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the transparent base film is typically in a range of 20 µm to 100 µm.

In the present invention, it is particularly preferable that the transparent base film is a cellulose ester-based film having a film thickness 20 to 70

[Alignment Film]

The optical film according to the embodiment of the present invention may have an alignment film between the transparent base film and the light absorption anisotropic layer.

The alignment film may be any layer as long as the dichroic coloring agent compound can be in a desired alignment state on the alignment film.

For example, a film formed of a polyfunctional acrylate compound or polyvinyl alcohol may be used. Polyvinyl alcohol is particularly preferable.

[Barrier Layer]

It is preferable that the optical film according to the embodiment of the present invention includes a barrier layer together with the light absorption anisotropic layer.

Here, the barrier layer is also referred to as a gas-shielding layer (oxygen-shielding layer) and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

From the viewpoint of suppressing internal reflection caused by the high refractive index of the light absorption anisotropic layer, it is preferable that the optical film according to the embodiment of the present invention includes a refractive index adjusting layer. The refractive index adjusting layer is a layer disposed in contact with the light absorption anisotropic layer and has an in-plane average refractive index of 1.55 or greater and 1.70 or less at a wavelength of 550 nm. It is preferable that the refractive index adjusting layer is a refractive index adjusting layer for performing so-called index matching.

[Tint Adjusting Layer]

It is preferable that the optical film according to the embodiment of the present invention includes a tint adjusting layer containing at least one coloring agent compound. It is preferable that the coloring agent compound contained in the tint adjusting layer is in a non-aligned state.

In a case where the amount of the coloring agent in the light absorption anisotropic layer is adjusted, a change in tint as viewed in an oblique direction with respect to the transmittance central axis is increased, but the change in tint in the oblique direction with respect to the change in tint of the transmittance central axis can be suppressed by adjusting the tint using the tint adjusting layer.

The tint adjusting layer may have only the function of the tint adjusting layer or may have functions integrated with functions of other layers.

The absorption peak wavelength of the coloring agent compound contained in the tint adjusting layer is preferably 500 nm or greater and 650 nm or less and more preferably 550 nm or greater and 600 nm or less. The tint of the optical film in the present invention can be adjusted to be more neutral by setting the absorption of the coloring agent compound to be in the above-described ranges.

Examples of the coloring agent compound contained in the tint adjusting layer include azo, methine, anthraquinone, triarylmethane, oxazine, azomethine, phthalocyanine, porphyrin, perylene, pyrrolopyrrole, and squarylium. Among these, from the viewpoints of enhancing the absorption waveform, the heat resistance, and the light resistance, azo, phthalocyanine, and anthraquinone are preferable, and anthraquinone is particularly preferable. Other examples thereof include coloring agent compounds described in "Functional Coloring Agents", co-authored by Shin Okawara, Ken Matsuoka, Tsuneaki Hirashima, and Eijiro Kitao, Kodansha Ltd., 1992, supervised by Sumio Tokita, and "Electronics-related Materials", CMC Publishing Co., Ltd., 1998.

Specific examples of the coloring agent compound used in the present invention are shown below, but the present invention is not limited thereto.

•Anthraquinone

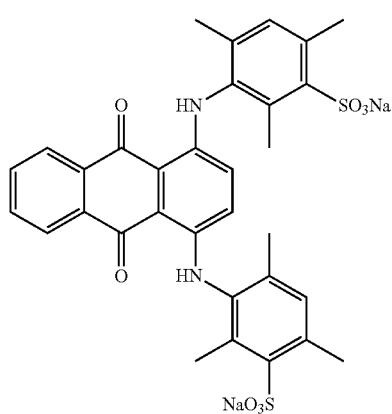

A-1

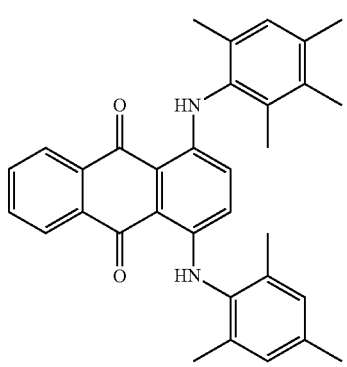

A-2

-continued
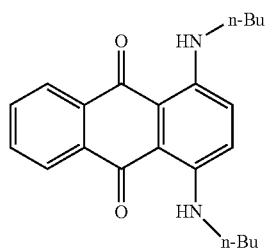
A-3
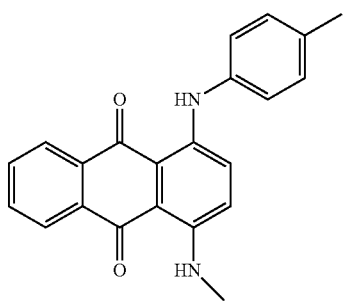
A-4
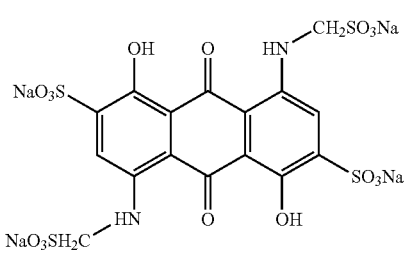
A-5
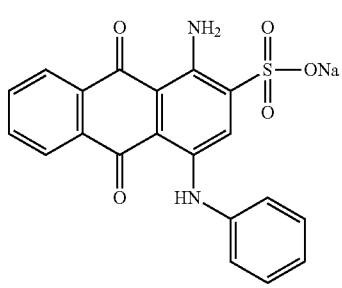
A-6
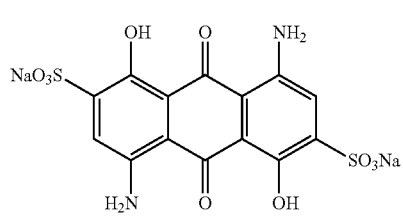
A-7
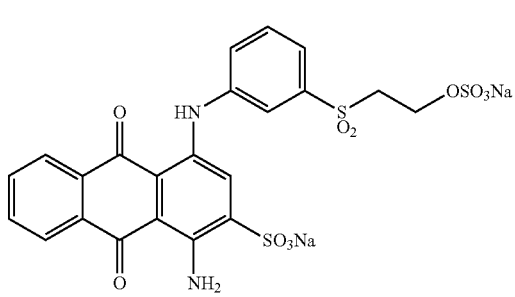
A-8
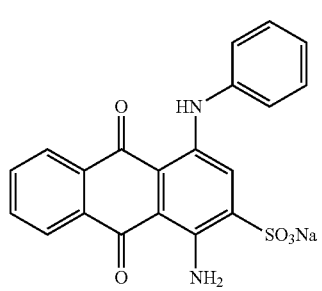
A-9
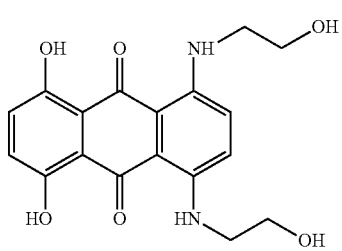
A-10
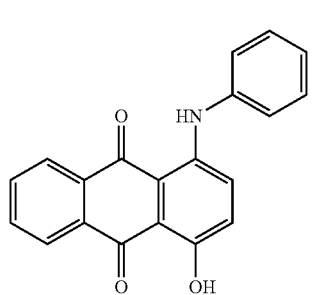
A-11
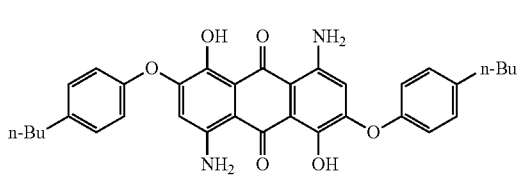
A-12

-continued
•Azo
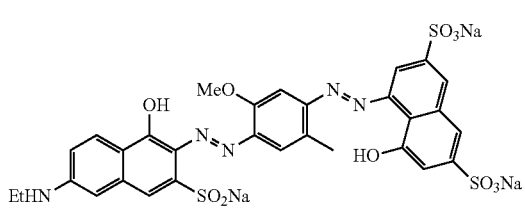
B-1
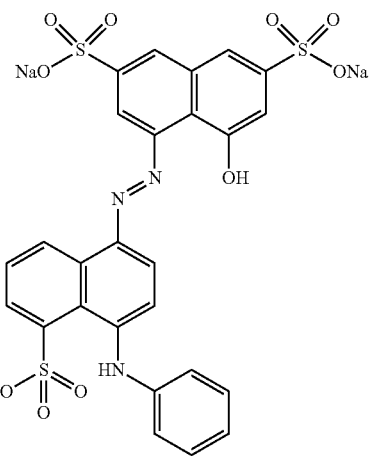
B-2
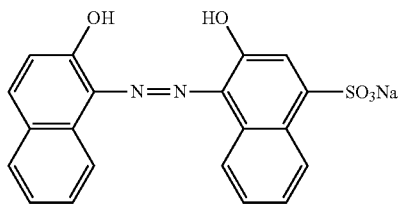
B-3
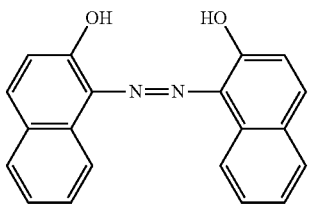
B-4
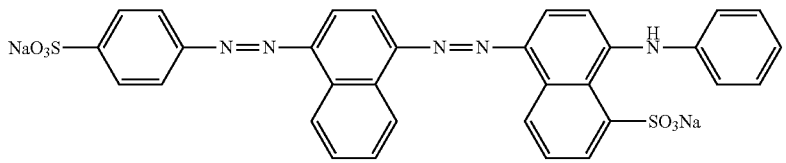
B-5
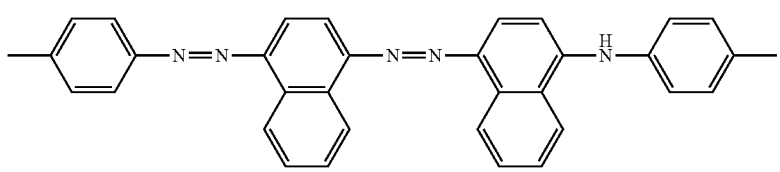
B-6
•Triarylmethane
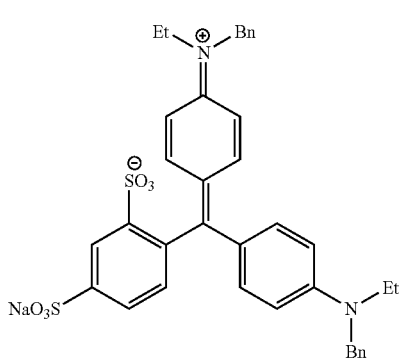
T-1
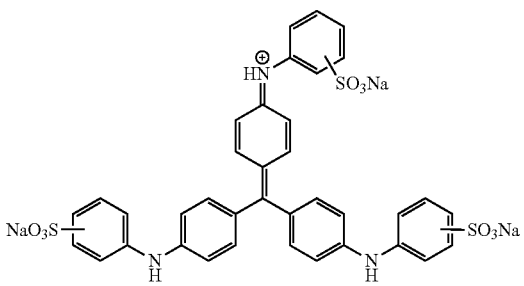
T-2

•Oxazine

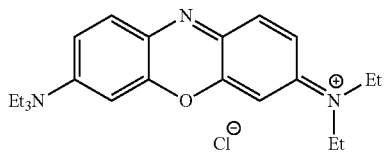

O-1

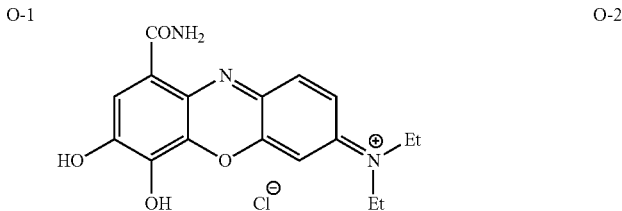

O-2

•Phthalocyanine

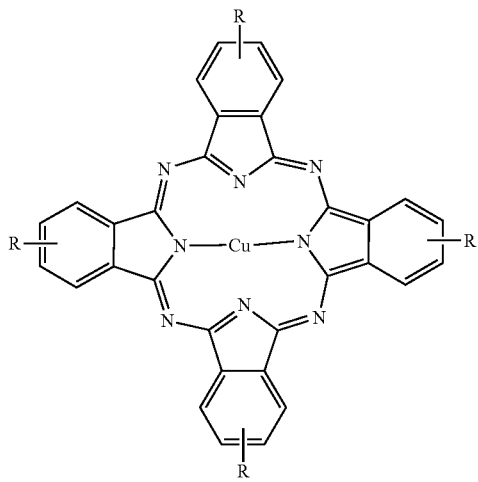

PH-1

R = SO₃Na

[Method of Producing Optical Film]

Examples of a method of producing the optical film according to the embodiment of the present invention include a method of sequentially performing a step of coating the transparent base film with a composition for forming an alignment film to form an alignment film, and a step of coating the alignment film with the composition for forming a light absorption anisotropic layer and aligning a dichroic coloring agent compound contained in the coating film to obtain the light absorption anisotropic layer.

Each step can be carried out according to a known method and is not particularly limited.

[Electroluminescence Display Device]

An electroluminescence (EL) display device according to the embodiment of the present invention is an EL display device in which the above-described optical film according to the embodiment of the present invention is laminated on an EL substrate including light emitting elements of multiple colors by EL.

Further, it is preferable that the EL display device according to the embodiment of the present invention is a self-light emitting display device that utilizes an inorganic EL light emitting element.

Further, it is preferable that the light emitting element of the EL display device according to the embodiment of the present invention is a light emitting diode (LED).

[EL Substrate]

In the present invention, various known EL substrates used in self-light emitting display devices that utilize an inorganic EL light emitting element and the like can be used as the EL substrate. In the EL substrate, a plurality of R light emitting elements, a plurality of G light emitting elements, and a plurality of B light emitting elements are two-dimensionally arranged, similarly to a known EL substrate.

In one aspect, the EL substrate may be a transparent substrate. Further, it is preferable that inorganic EL light emitting elements are arranged on a transparent substrate. In a case of using a transparent substrate, a display device having high designability, in which the background of the display device can be seen through and the reflection of external light on the surface of the substrate is suppressed, can be realized.

In the EL display device according to the embodiment of the present invention, in a case where the light emitting elements are light emitting diodes (LED), the LEDs have three colors of red, green, and blue, and brightnesses of the colors at 460 nm, 530 nm, and 630 nm in a normal direction of the electroluminescence display device are respectively defined as Lb, Lg, and Lr, it is preferable that both relationships of Expressions (3) and (4) are satisfied.

$$3 \leq Lg/Lb \leq 8 \tag{3}$$

$$0.5 \leq Lr/Lb \leq 2.5 \tag{4}$$

Here, "brightnesses of the colors at 460 nm, 530 nm, and 630 nm in a normal direction of the electroluminescence display device" can be measured by, for example, a spectroradiometer SR-UL1R (manufactured by Topcon Technohouse Corporation).

EXAMPLES

Hereinafter, the present invention will be described in detail based on examples. The materials, the reagents, the amounts of materials, and the proportions of the materials, the operations, and the like shown in the following examples can be appropriately changed within a range not departing from the scope of the present invention. Therefore, the present invention is not limited to the following examples.

Example 1

<Formation of Alignment Film>

A surface of a cellulose acylate film (TAC base material having a thickness of 40 μm; TG40, FUJIFILM Corporation) was saponified with an alkaline solution and coated with a composition for forming an alignment film using a wire bar. The support on which the coating film was formed was dried with hot air at 60° C. for 60 seconds and further dried with hot air at 100° C. for 120 seconds to form an alignment film AL1, thereby obtaining a TAC film 1 with an alignment film. The film thickness was 1 μm.

| (Composition 1 for forming alignment film) |
|---|
| Modified polyvinyl alcohol PVA-1: 3.80 parts by mass |
| IRGACURE 2959: 0.20 parts by mass |
| Water: 70 parts by mass |
| Methanol: 30 parts by mass |

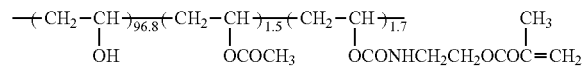

Modified polyvinyl alcohol PVA-1

<Formation of Light Absorption Anisotropic Layer P1>

Next, the obtained alignment film AL1 was continuously coated with the following composition P1 for forming a light absorption anisotropic layer using a wire bar, heated at 120° C. for 60 seconds, and cooled to room temperature (23° C.).

Next, the alignment film was heated at 80° C. for 60 seconds and cooled to room temperature again.

Thereafter, a light absorption anisotropic layer P1 was formed on the alignment film 1 by irradiating the alignment film with an LED lamp (central wavelength of 365 nm) for 2 seconds under an irradiation condition of an illuminance of 200 mW/cm$^2$. The film thickness of the light absorption anisotropic layer P1 was 3.5 μm.

| Composition of composition P1 for forming light absorption anisotropic layer |
|---|
| Dichroic coloring agent compound D-1 shown below: 0.63 parts by mass |
| Dichroic coloring agent compound D-2 shown below: 0.85 parts by mass |
| Polymer liquid crystal compound P-1 shown below: 8.63 parts by mass |
| IRGACURE OXE-02 (manufactured by BASF SE): 0.16 parts by mass |
| Compound E-1 shown below: 0.13 parts by mass |
| Compound E-2 shown below: 0.13 parts by mass |
| Surfactant F-1 shown below: 0.004 parts by mass |
| Cyclopentanone: 80.53 parts by mass |
| Benzyl alcohol 8.95 parts by mass |

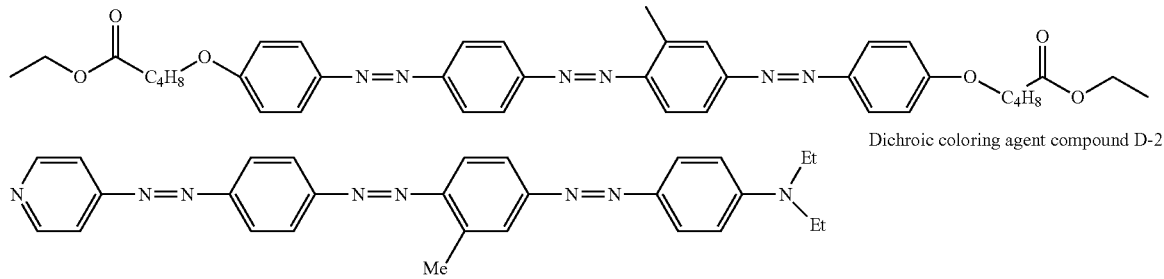

Dichroic coloring agent compound D-1

Dichroic coloring agent compound D-2

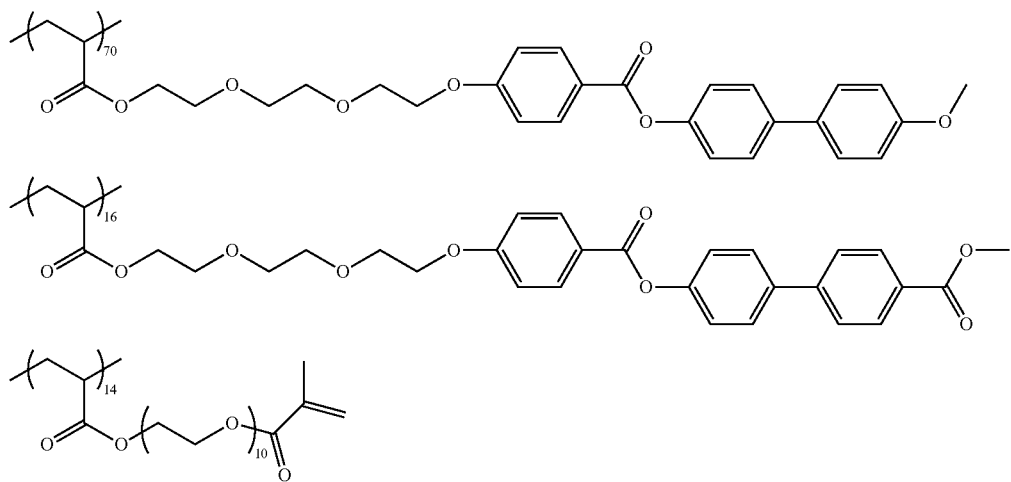

Polymer liquid crystal compound P-1

Compound E-1

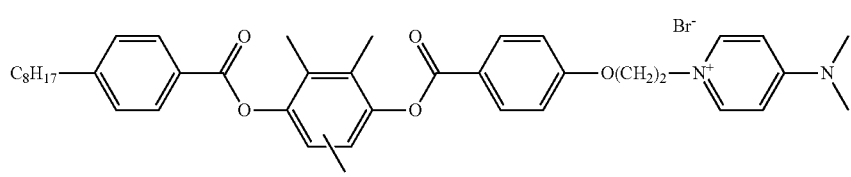

Compound E-2

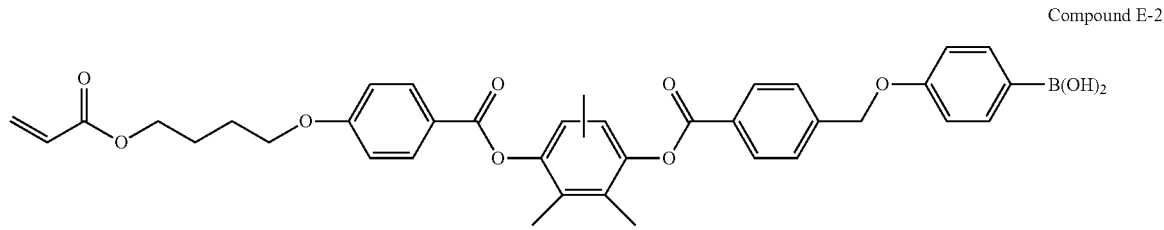

Surfactant F-1

<Formation of Oxygen-Shielding Layer B 1>

The formed light absorption anisotropic layer P1 was continuously coated with a coating solution having the following composition (composition B 1 for forming an oxygen-shielding layer) using a wire bar. Thereafter, the layer was dried with hot air at 100° C. for 2 minutes, thereby forming a polyvinyl alcohol (PVA) alignment layer (oxygen-shielding layer B1) having a thickness of 0.5 μm on the light absorption anisotropic layer P1.

In this manner, an optical film 1 in which the cellulose acylate film, the alignment film AL1, the light absorption anisotropic layer P1, and the oxygen-shielding layer B 1 were adjacent to each other in this order was obtained.

| Composition of composition B1 for forming oxygen-shielding layer by mass |
|---|
| Modified polyvinyl alcohol shown below: 3.80 parts by mass<br>Polymerization initiator IRGACURE 2959 (manufactured by BASF SE): 0.20 parts |

| -continued |
|---|
| Composition of composition B1 for forming oxygen-shielding layer by mass |
| Water: 70 parts by mass<br>Methanol: 30 parts by mass |

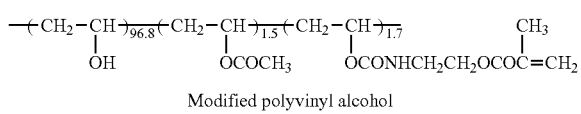

Modified polyvinyl alcohol

Example 2

An optical film 2 was prepared in the same manner as in Example 1 except that the dichroic coloring agent compound D-2 was changed to the following dichroic coloring agent compound D-3.

Dichroic coloring agent compound D-3

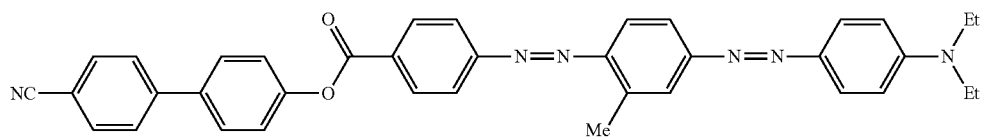

Example 3

An optical film 3 was prepared in the same manner as in Example 1 except that the dichroic coloring agent compound D-2 was changed to the following dichroic coloring agent compound D-4.

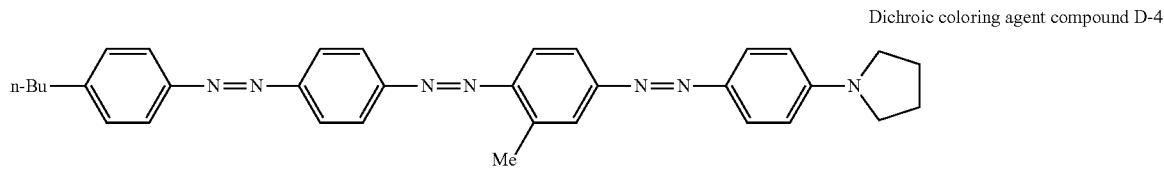

Dichroic coloring agent compound D-4

Comparative Example 1

An optical film 4 was prepared in the same manner as in Example 1 except that the dichroic coloring agent compound D-2 was changed to the following dichroic coloring agent compound D-5.

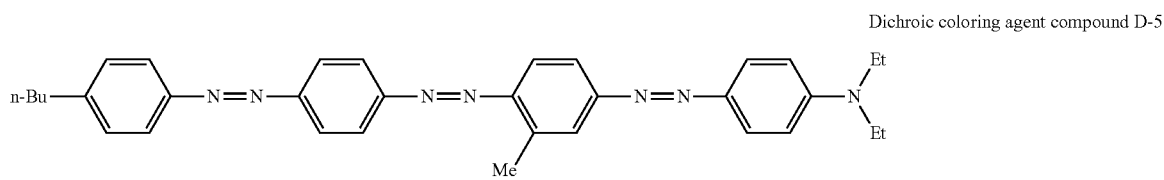

Dichroic coloring agent compound D-5

Comparative Example 2

An optical film 5 was prepared in the same manner as in Example 1, except that the composition of the light absorption anisotropic layer P1 was changed to the composition of P5 described below.

| Composition of composition P5 for forming light absorption anisotropic layer |
|---|
| Dichroic coloring agent compound D-1 shown above: 0.63 parts by mass |
| Dichroic coloring agent compound D-3 shown above: 0.17 parts by mass |
| Polymer liquid crystal compound P-1 shown above: 9.31 parts by mass |
| IRGACURE OXE-02 (manufactured by BASF SE): 0.16 parts by mass |
| Compound E-1 shown above: 0.13 parts by mass |
| Compound E-2 shown above: 0.13 parts by mass |
| Surfactant F-1 shown below: 0.004 parts by mass |
| Cyclopentanone: 80.53 parts by mass |
| Benzyl alcohol 8.95 parts by mass |

Example 4

An optical film 6 was prepared in the same manner as in Example 1, except that the composition of the light absorption anisotropic layer P1 was changed to the composition of P6 described below.

| Composition of composition P6 for forming light absorption anisotropic layer |
|---|
| Dichroic coloring agent compound D-6 shown below: 0.80 parts by mass |
| Polymer liquid crystal compound P-1 shown above: 9.31 parts by mass |
| IRGACURE OXE-02 (manufactured by BASF SE): 0.16 parts by mass |
| Compound E-1 shown above: 0.13 parts by mass |

| -continued |
|---|
| Composition of composition P6 for forming light absorption anisotropic layer |
| Compound E-2 shown above: 0.13 parts by mass |
| Surfactant F-1 shown below: 0.004 parts by mass |
| Cyclopentanone: 80.53 parts by mass |
| Benzyl alcohol 8.95 parts by mass |

Dichroic coloring agent compound D-6

Example 5

An optical film 7 was prepared in the same manner as in Example 1, except that the composition of the light absorption anisotropic layer P1 was changed to the composition of P7 described below.

| Composition of composition P7 for forming light absorption anisotropic layer |
|---|
| Dichroic coloring agent compound D-1 shown above: 0.50 parts by mass |
| Dichroic coloring agent compound D-2 shown above: 0.68 parts by mass |
| Dichroic coloring agent compound D-6 shown above: 0.30 parts by mass |
| Polymer liquid crystal compound P-1 shown above: 8.63 parts by mass |
| IRGACURE OXE-02 (manufactured by BASF SE): 0.16 parts by mass |
| Compound E-1 shown above: 0.13 parts by mass |
| Compound E-2 shown above: 0.13 parts by mass |

-continued

Composition of composition P7 for forming
light absorption anisotropic layer

Surfactant F-1 shown below: 0.004 parts by mass
Cyclopentanone: 80.53 parts by mass
Benzyl alcohol 8.95 parts by mass Comparative Example 3

An optical film 8 was prepared in the same manner as in Example 5, except that the dichroic coloring agent compound D-6 was changed to the following dichroic coloring agent compound D-7.

Dichroic coloring agent compound D-7

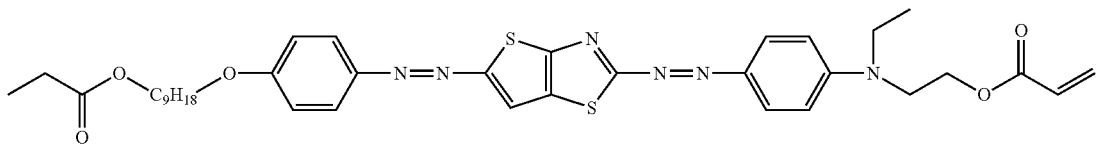

[Evaluation of Performance]

[Transmittance]

The transmittances (Tb, Tg, and Tr) of the obtained optical film at 460 nm, 530 nm, and 630 nm in a direction of 45° with respect to the normal direction of the film were measured by the method described above. The calculation results of Tb/Tr and Tg/Tr are listed in Table 1.

Further, the transmittances (front transmittances) of the obtained optical film at 460 nm, 530 nm, and 630 nm in the normal direction of the film were measured by the method described above.

[Evaluation of Tint at 45°]

A micro LED was prepared with reference to Optics Express 27 (12) A746 to A757. The brightnesses of the prepared micro LED on the front surface and in a direction of 45° at 460 nm, 530 nm, and 630 nm were measured using a spectroradiometer SR-UL1R (manufactured by Topcon Technohouse Corporation).

As a result, Lg/Lb was 6.5 and Lr/Lb was 1.8 in a case where the front surface was displayed in white.

Further, color shift in the direction of 45° occurred in the case where the front surface was adjusted to be displayed in white. Further, in a case where the brightnesses at 460 nm, 530 nm, and 630 nm in the direction of 45° were respectively defined as Lb (45), Lg (45), and Lr (45), Lg (45)/Lb (45) was 4.8, and Lr (45)/Lb (45) was 0.6. Here, the average value of the brightnesses in the direction of 45°, that is, the four azimuthal angles of up, down, left, and right of the panel, was used.

Next, the optical film obtained above was disposed on the upper surface of the prepared micro LED, and adjustment was made such that the front surface was displayed in white again. Thereafter, the tint was confirmed in the direction of 45°, and the evaluation was performed as follows.

A: The tint was neutral without color shift
B: Color shift was slightly found, but the tint was substantially neutral.
C: Color shift was found, and the tint was not neutral.

[Alignment Degree]

The alignment degree of the obtained light absorption anisotropic layer at a wavelength of 530 nm was measured by the method described above.

The evaluation results are shown in Table 1 below. Further, the ratio in Table 1 denotes the ratio of each dichroic coloring agent compound in a case where the total solid content was set to 100%.

TABLE 1

| | Dichroic coloring agent compound 1 | | | Dichroic coloring agent compound 2 | | | Dichroic coloring agent compound 3 | | |
|---|---|---|---|---|---|---|---|---|---|
| | Compound | Peak wavelength | Ratio | Compound | Peak wavelength | Ratio | Compound | Peak wavelength | Ratio |
| Example 1 | D-1 | 440 | 6.0% | D-2 | 580 | 8.1% | — | — | |
| Example 2 | D-1 | 440 | 6.0% | D-3 | 530 | 8.1% | — | — | |
| Example 3 | D-1 | 440 | 6.0% | D-4 | 540 | 8.1% | — | — | |
| Comparative Example 1 | D-1 | 440 | 6.0% | D-5 | 570 | 8.1% | — | — | |
| Comparative Example 2 | D-1 | 440 | 6.0% | D-3 | 530 | 1.6% | — | — | |
| Example 4 | D-6 | 500 | 7.6% | — | — | — | — | — | |
| Example 5 | D-1 | 440 | 4.7% | D-2 | 580 | 6.5% | D-6 | 500 | |
| Comparative Example 3 | D-1 | 440 | 4.7% | D-2 | 580 | 6.5% | D-7 | 590 | |

TABLE 1-continued

|  | Dichroic coloring agent compound 3 Ratio | Expression (1) Tb/Tr | Expression (2) Tg/Tr | Evaluation of tint at 45° | Front transmittance | | | Alignment degree at 530 nm |
|---|---|---|---|---|---|---|---|---|
|  |  |  |  |  | 450 nm | 530 nm | 630 nm |  |
| Example 1 | — | 0.50 | 0.60 | B | 70% | 75% | 75% | 0.93 |
| Example 2 | — | 0.30 | 0.40 | A | 40% | 45% | 85% | 0.71 |
| Example 3 | — | 0.25 | 0.30 | A | 70% | 75% | 85% | 0.91 |
| Comparative Example 1 | — | 0.55 | 0.80 | C | 30% | 45% | 60% | 0.61 |
| Comparative Example 2 | — | 0.30 | 0.70 | C | 60% | 70% | 85% | 0.73 |
| Example 4 | — | 0.40 | 0.40 | A | 70% | 70% | 85% | 0.92 |
| Example 5 | 2.8% | 0.20 | 0.25 | B | 65% | 70% | 85% | 0.85 |
| Comparative Example 3 | 2.8% | 0.80 | 0.90 | C | 70% | 75% | 75% | 0.95 |

As shown in the results listed in Table 1, it was found that in a case where the alignment degree of the light absorption anisotropic layer was less than 0.7 and the optical film did not satisfy Expressions (1) and (2), the transmittance of the front surface was decreased, and a change in tint in an oblique direction with respect to the front surface could not be suppressed (Comparative Example 1).

Further, it was found that a change in tint in an oblique direction with respect to the front surface could not be suppressed in a case where the optical film did not satisfy at least one of Expression (1) or (2) even though the alignment degree of the light absorption anisotropic layer was 0.7 or greater (Comparative Examples 2 and 3).

On the contrary, it was found that in a case where the alignment degree of the light absorption anisotropic layer was 0.7 or greater and the optical film satisfied both Expressions (1) and (2), a decrease in the transmittance of the front surface could be suppressed, and a change in tint in an oblique direction with respect to the front surface could be suppressed (Examples 1 to 5).

What is claimed is:

1. An optical film comprising:
a light absorption anisotropic layer containing a dichroic coloring agent compound,
wherein the light absorption anisotropic layer has an absorption axis in a normal direction of the film and has an alignment degree of 0.7 or greater at 530 nm, and
in a case where transmittances at 460 nm, 530 nm, and 630 nm in a direction of 45° with respect to the normal direction of the film are respectively defined as Tb, Tg, and Tr, relationships of Expressions (1) and (2) are satisfied, $$0.1 \leq Tb/Tr \leq 0.5 \quad (1)$$

$$0.2 \leq Tg/Tr \leq 0.6 \quad (2).$$

2. The optical film according to claim 1,
wherein the light absorption anisotropic layer contains two or more kinds of the dichroic coloring agent compounds.

3. The optical film according to claim 2,
wherein the light absorption anisotropic layer contains a dichroic coloring agent compound having an absorption peak at 430 nm or greater and less than 500 nm and a dichroic coloring agent compound having an absorption peak at 500 nm or greater and 560 nm or less.

4. The optical film according to claim 2,
wherein the transmittance at 530 nm in the normal direction of the film is 50% or greater.

5. The optical film according to claim 2,
wherein the transmittance at 530 nm in the normal direction of the film is 70% or greater.

6. The optical film according to claim 2,
wherein the transmittance at 630 nm in the normal direction of the film is 75% or greater.

7. An electroluminescence display device,
wherein the optical film according to claim 2 is laminated on an electroluminescence substrate including light emitting elements of multiple colors by electroluminescence.

8. The electroluminescence display device according to claim 7,
wherein the light emitting elements are light emitting diodes.

9. The electroluminescence display device according to claim 8,
wherein the light emitting diodes have three colors of red, green, and blue, and in a case where brightnesses of the colors at 460 nm, 530 nm, and 630 nm in a normal direction of the electroluminescence display device are respectively defined as Lb, Lg, and Lr, both relationships of Expressions (3) and (4) are satisfied, $$3 \leq Lg/Lb \leq 8 \quad (3)$$

$$0.5 \leq Lr/Lb \leq 2.5 \quad (4).$$

10. The optical film according to claim 1,
wherein the light absorption anisotropic layer contains a dichroic coloring agent compound having an absorption peak at 430 nm or greater and less than 500 nm and a dichroic coloring agent compound having an absorption peak at 500 nm or greater and 560 nm or less.

11. The optical film according to claim 10,
wherein the transmittance at 530 nm in the normal direction of the film is 50% or greater.

12. The optical film according to claim 10,
wherein the transmittance at 530 nm in the normal direction of the film is 70% or greater.

13. The optical film according to claim 10,
wherein the transmittance at 630 nm in the normal direction of the film is 75% or greater.

14. An electroluminescence display device,
wherein the optical film according to claim 10 is laminated on an electroluminescence substrate including light emitting elements of multiple colors by electroluminescence.

15. The optical film according to claim 1,
wherein the transmittance at 530 nm in the normal direction of the film is 50% or greater.

16. The optical film according to claim 1,
wherein the transmittance at 530 nm in the normal direction of the film is 70% or greater.

17. The optical film according to claim 1,
wherein the transmittance at 630 nm in the normal direction of the film is 75% or greater.

18. An electroluminescence display device,
wherein the optical film according to claim 1 is laminated on an electroluminescence substrate including light emitting elements of multiple colors by electroluminescence.

19. The electroluminescence display device according to claim 18,
wherein the light emitting elements are light emitting diodes.

20. The electroluminescence display device according to claim 19,
wherein the light emitting diodes have three colors of red, green, and blue, and in a case where brightnesses of the colors at 460 nm, 530 nm, and 630 nm in a normal direction of the electroluminescence display device are respectively defined as Lb, Lg, and Lr, both relationships of Expressions (3) and (4) are satisfied, $$3 \leq Lg/Lb \leq 8 \quad (3)$$

$$0.5 \leq Lr/Lb \leq 2.5 \quad (4).$$

* * * * *